US009048518B2

(12) United States Patent
Kudela et al.

(10) Patent No.: US 9,048,518 B2
(45) Date of Patent: Jun. 2, 2015

(54) TRANSMISSION LINE RF APPLICATOR FOR PLASMA CHAMBER

(75) Inventors: Jozef Kudela, San Jose, CA (US); Tsutomu Tanaka, Santa Clara, CA (US); Carl A. Sorensen, Morgan Hill, CA (US); Suhail Anwar, San Jose, CA (US); John M. White, Hayward, CA (US); Ranjit Indrajit Shinde, Bangalore (IN); Seon-Mee Cho, Santa Clara, CA (US); Douglas D. Truong, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 54 days.

(21) Appl. No.: 13/507,383

(22) Filed: Jun. 21, 2012

(65) Prior Publication Data

US 2013/0221833 A1    Aug. 29, 2013

Related U.S. Application Data

(63) Continuation-in-part of application No. 13/282,469, filed on Oct. 27, 2011.

(60) Provisional application No. 61/499,205, filed on Jun. 21, 2011.

(51) Int. Cl.
| | |
|---|---|
| *H01J 17/26* | (2012.01) |
| *H01J 61/28* | (2006.01) |
| *H01P 3/00* | (2006.01) |
| *H05H 1/24* | (2006.01) |
| *H01P 11/00* | (2006.01) |
| *H01J 37/32* | (2006.01) |
| *H05H 1/46* | (2006.01) |
| *H01P 3/06* | (2006.01) |

(Continued)

(52) U.S. Cl.
CPC .. *H01P 3/00* (2013.01); *H05H 1/24* (2013.01); *H01P 11/003* (2013.01); *Y10T 29/49169* (2015.01); *H01J 37/3222* (2013.01); *H05H 1/46* (2013.01); *H05H 2001/463* (2013.01); *H01J 37/32577* (2013.01); *H01P 3/06* (2013.01); *H01P 3/085* (2013.01); *H01Q 13/22* (2013.01)

(58) Field of Classification Search
None
See application file for complete search history.

(56) References Cited

U.S. PATENT DOCUMENTS

| | | | |
|---|---|---|---|
| 5,370,765 A | 12/1994 | Dandl | |
| 6,060,836 A * | 5/2000 | Maeno et al. | ............ 315/111.21 |
| 6,211,621 B1 | 4/2001 | Caughran | |

(Continued)

FOREIGN PATENT DOCUMENTS

JP    4017796 B2    12/2007

OTHER PUBLICATIONS

F. Werner et al, "Slot antenna 2.45 GHz microwave plasma source", Plasma Sources Sci. Technol., vol. 3, No. 4, p. 473, Abstract only (1994).

(Continued)

*Primary Examiner* — Natalie Walford
(74) *Attorney, Agent, or Firm* — Robert J. Stern

(57) ABSTRACT

A transmission line RF applicator apparatus and method for coupling RF power to a plasma in a plasma chamber. The apparatus comprises an inner conductor and one or two outer conductors. The main portion of each of the one or two outer conductors includes a plurality of apertures that extend between an inner surface and an outer surface of the outer conductor.

20 Claims, 13 Drawing Sheets

(51) Int. Cl.
*H01P 3/08* (2006.01)
*H01Q 13/22* (2006.01)

(56) References Cited

U.S. PATENT DOCUMENTS

| | | | |
|---|---|---|---|
| 6,271,148 | B1 | 8/2001 | Kao |
| 7,381,292 | B2 | 6/2008 | Lee et al. |
| 2008/0236491 | A1 | 10/2008 | Brcka |
| 2009/0242131 | A1 | 10/2009 | Mai |
| 2011/0097518 | A1 | 4/2011 | Olgado |
| 2012/0031333 | A1 | 2/2012 | Kurita |
| 2012/0031335 | A1 | 2/2012 | Kurita |
| 2012/0217874 | A1 | 8/2012 | Kudela |
| 2013/0126331 | A1 | 5/2013 | Kudela |

OTHER PUBLICATIONS

Y. Shiraki et al., "R&D of new surface wave produced plasma in VHF band", Proc. 15th Symposium on Plasma Processing, pp. 202-205 (1998).
E. Rauchle, "Duo-plasmaline, a surface wave sustained linearly extended discharge", J. Phys. IV France, vol. 8, pp. Pr7-99-Pr7-108 (1998).
D. Korzec et al., "Planar Slot Antenna Plasma Source: Development and Characterization", 15th Symposium on Plasma Processing, Hamamatsu, Japan, pp. 170-173 (1998).
M. Moisan et al., "The Development and Use of Surface-Wave Sustained Discharges for Applications", Advanced Technologies Based on Wave and Beam Generated Plasmas, ed. H. Schluter & A. Shivarova, NATO ASI Partnership Subseries 3, Kluwer Academic Publisher, pp. 1-42 (Netherlands 1999).
H Sugai et al., "High-density flat plasma production based on surface waves", Plasma Sources Sci. Technol. 7 (UK 1998), pp. 192-205.
M. Walker et al, "Silicon oxide films from the Plasmodul", Vacuum 57, pp. 387-397 (2000).
T-R Ji & J. Gerling, "A versatile microwave plasma applicator", International Microwave Power Institute, pp. 3-10 (1988).
Sauve et al, "Slotted waveguide field applicator for the generation of long uniform plasmas", Journal of Micrrowave Power and Electromagnet Energy, vol. 28, No. 3, pp. 123-131 (1993).
T. Yamamoto et al, "Design of radial line slot antennas at 8.3 GHz for large area uniform plasma generation", Jpn. J. Appl. Phys., vol. 38, pp. 2082-2088 (1999).
Y. Yasaka et al, "Production of large-diameter uniform plasma in mTorr range using microwave discharge", Jpn. J. Appl. Phys., vol. 38, pp. 4309-4212 (1999).
M. Kanoh et al, "Inductively coupled plasma source with internal straight antenna", Jpn. J. Appl. Phys., vol. 40, pp. 5419-5423 (2001).
Kyong Nam Kim et al., "Characteristics of Parallel Internal-Type Inductively Coupled Plasmas for Large Area Flat Panel Display Processing", Japanese Journal of Applied Physics, vol. 43, No. 7A (Japan 2004), pp. 4373-4375.
Yoshiaki Takeuchi, "Characteristics of Very-High-Frequency-Excited SiH4 Plasmas using a Ladder-Shaped Electrode", Japanese Journal of Applied Physics, vol. 40, Part 1, No. 5A (Japan 2001), pp. 3405-3408.

\* cited by examiner

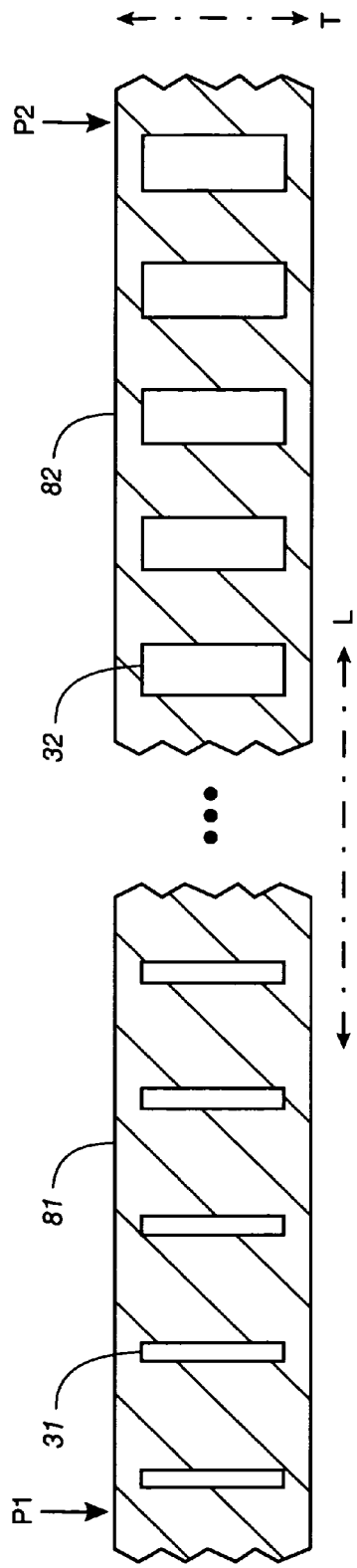
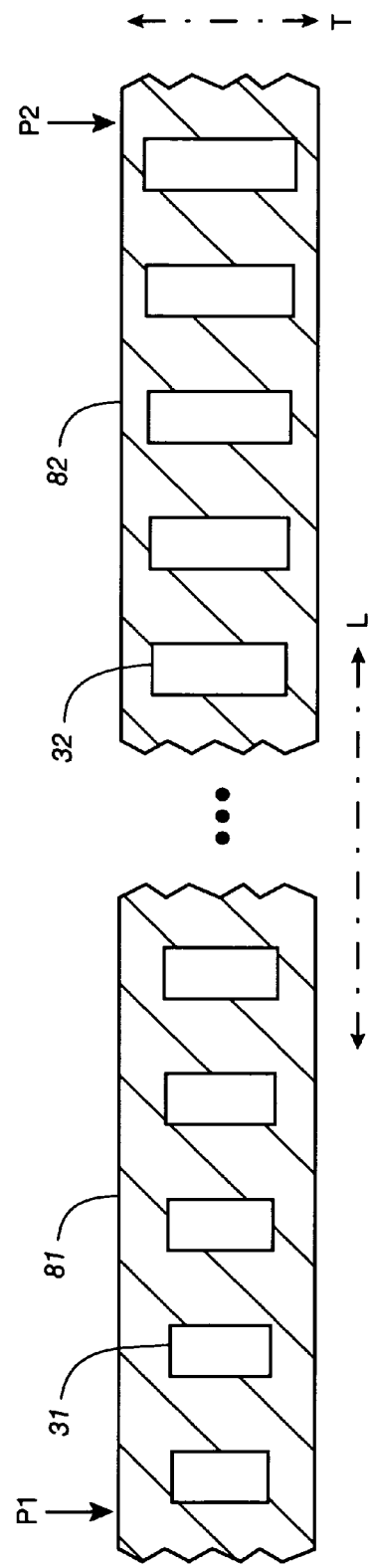

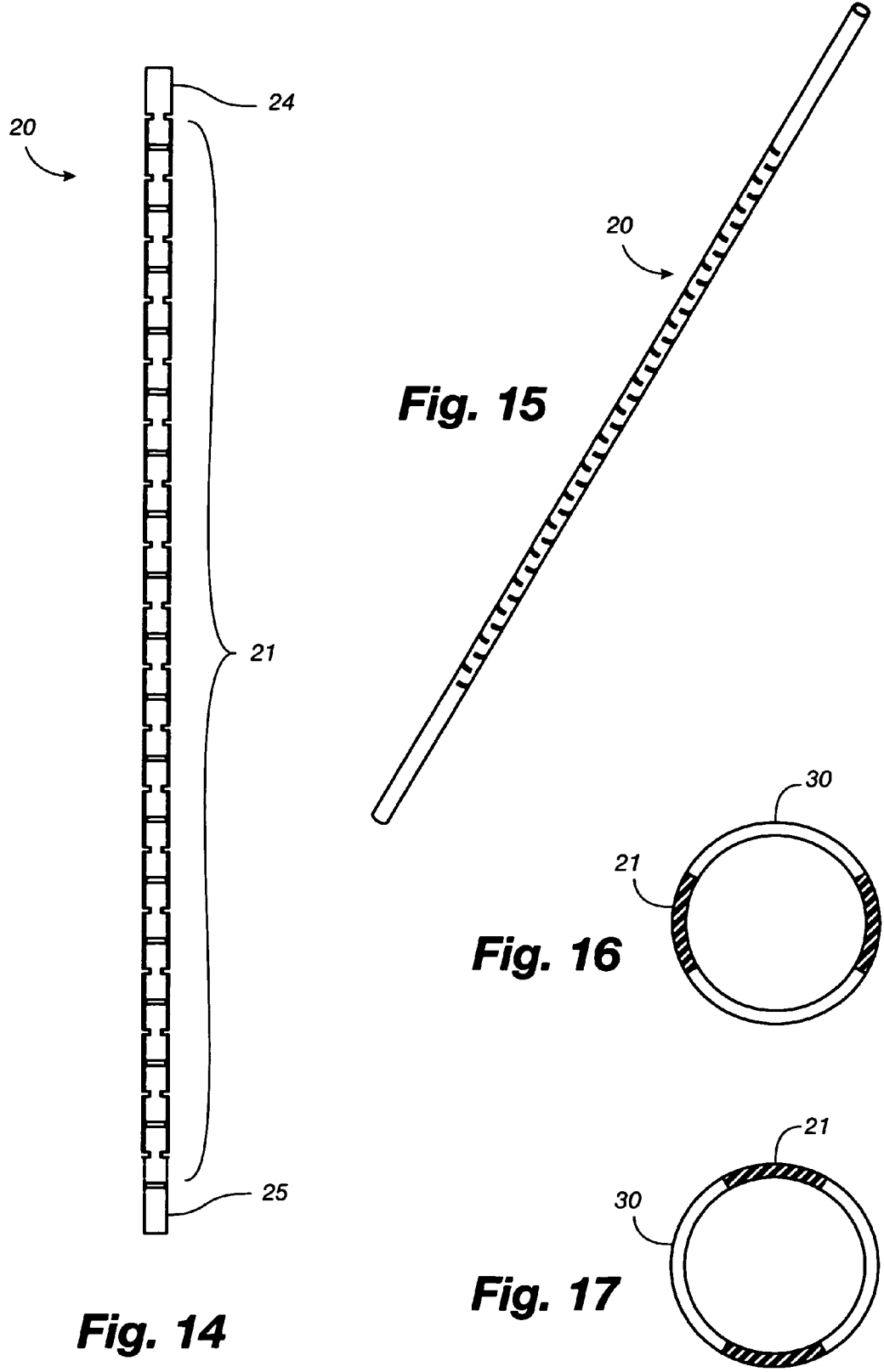

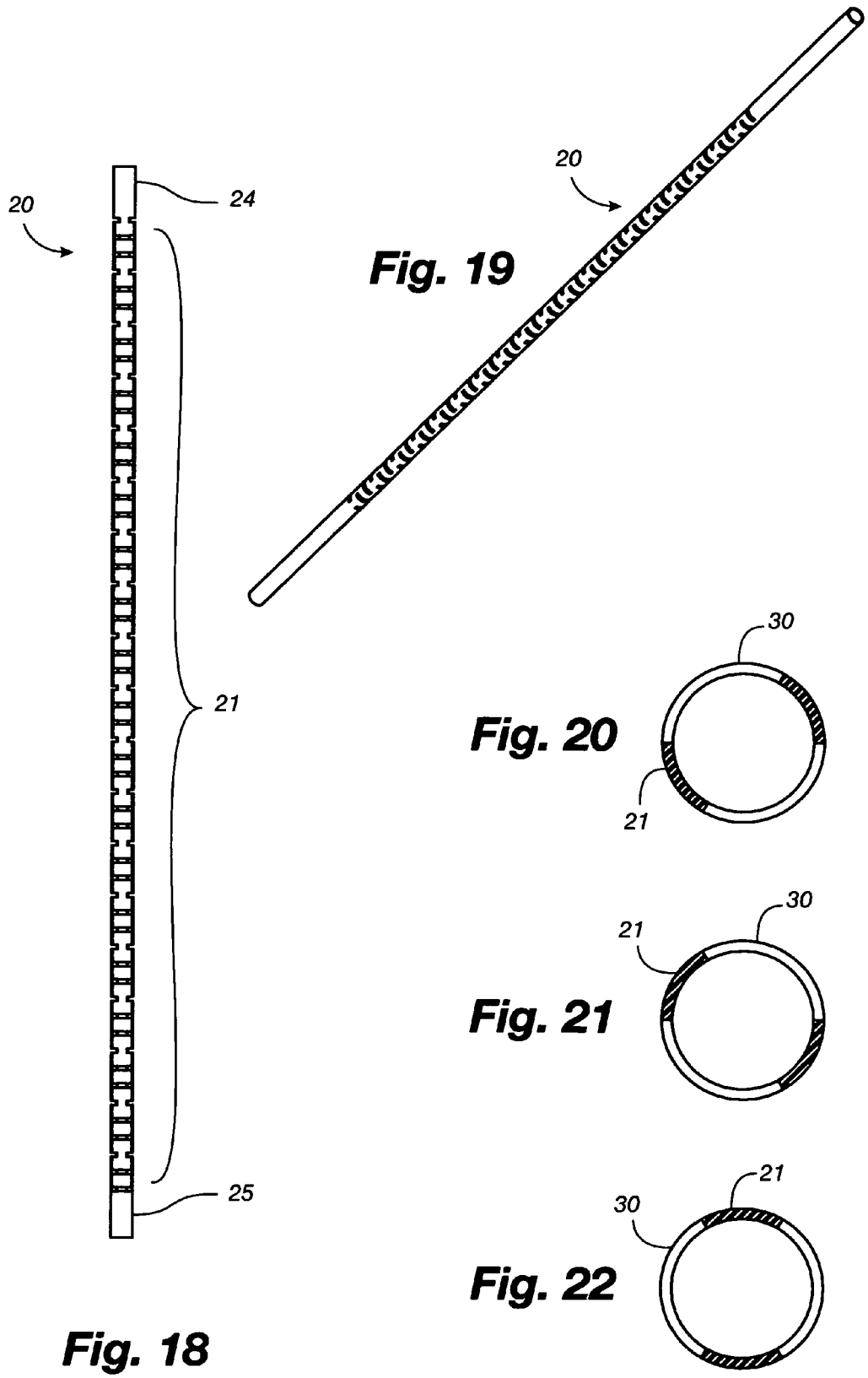

TRANSMISSION LINE RF APPLICATOR FOR PLASMA CHAMBER

CROSS REFERENCE TO RELATED APPLICATION

This patent application is a continuation-in-part of U.S. patent application Ser. No. 13/282,469 filed Oct. 27, 2011 and claims the benefit of U.S. Provisional Application No. 61/499,205 filed Jun. 21, 2011.

TECHNICAL FIELD

The invention relates generally to RF applicator apparatus and methods useful for coupling RF power to a plasma discharge in a plasma chamber for fabricating electronic devices such as semiconductors, displays and solar cells. The invention relates more specifically to such an RF applicator comprising an inner conductor and one or two outer conductors, wherein each outer conductor has apertures from which the RF applicator can radiate RF energy to a plasma in a plasma chamber.

BACKGROUND ART

Plasma chambers commonly are used to perform processes for fabricating electronic devices such as semiconductors, displays and solar cells. Such plasma fabrication processes include chemical vapor deposition of semiconductor, conductor or dielectric layers on the surface of a workpiece or etching of selected portions of such layers on the workpiece surface.

A plasma commonly is sustained in a plasma chamber by coupling RF power from an RF applicator to a gas or plasma within the chamber. The RF power excites the gas to a plasma state or provides the RF power necessary to sustain the plasma. Two broad categories of coupling techniques are an electrode that capacitively couples RF power to the plasma or an antenna that radiates electromagnetic radiation into the plasma.

One conventional type of antenna is an inductive coupler, also called an inductively coupled antenna, in which RF power is coupled to the plasma primarily by means of the magnetic field produced by the antenna. A shortcoming of an inductive coupler is that it generally cannot be operated at an RF frequency whose wavelength is less than the diameter of the inductive coupler. The inability to operate at a high RF frequency is a serious shortcoming in certain plasma chemistries.

Another conventional type of antenna is a hollow waveguide having slots in one waveguide wall through which RF power is radiated from the interior of the hollow waveguide to the plasma. A shortcoming of a hollow waveguide is that it cannot operate below a cutoff frequency, hence its width along one transverse axis must be at least one-half the wavelength of a signal propagating within the waveguide at the power source frequency. As a result of this width requirement, slotted hollow waveguide antennas typically have been used outside a dielectric window of a plasma chamber rather than inside a plasma chamber.

Another conventional type of antenna is a linear conductor surrounded by a cylindrical dielectric, with the combination being positioned within a plasma chamber so that it is surrounded by the plasma. One or both ends of the conductor are connected to receive power from a UHF or microwave power source. Power is coupled from the antenna to the plasma by means of an electromagnetic wave at the boundary between the plasma and the dielectric. A shortcoming of this type of antenna is that the power radiated by the antenna progressively decreases with distance from the end of the antenna that is connected to the power source. Even if both ends of the antenna are connected to a power source, the radiated power near the center of the antenna will be lower than the power near the ends, thereby degrading spatial uniformity of the plasma. The non-uniformity increases with the length of the antenna, hence this type of antenna is less desirable for large plasma chambers.

SUMMARY OF THE INVENTION

The invention is a transmission line RF applicator apparatus and method useful for coupling RF power to a plasma in a plasma chamber. The invention comprises an inner conductor and one or two outer conductors. The main portion of each of the one or two outer conductors includes a plurality of apertures that extend between an inner surface and an outer surface of the outer conductor.

In operation, when the output of an RF power source is connected between the inner conductor and the one or two outer conductors, the RF applicator radiates RF energy from the apertures in the one or two outer conductors. A single RF power source can be connected to the inner and outer conductors or, more preferably, two RF power supplies can be connected respectively to opposite ends of the RF applicator.

Another aspect of the invention is a plasma chamber that includes the aforesaid transmission line RF applicator in combination with a dielectric cover and first and second sealing apparatuses. The plasma chamber comprises a vacuum enclosure that encloses an interior of the plasma chamber. A main portion of the dielectric cover is positioned within the interior of the plasma chamber. The main portion of the aforesaid one or two outer conductors is positioned within the main portion of the dielectric cover. The first and second sealing apparatuses respectively abut first and second end portions of the dielectric cover such that the first and second sealing apparatuses, the dielectric cover and the vacuum enclosure in combination prevent fluid communication between the main portion of the outer conductor and the interior of the plasma chamber.

Preventing such fluid communication is advantageous to prevent the formation within the apertures of a gas discharge that would electrically short-circuit the apertures, thereby preventing the RF applicator from radiating RF power through the apertures. Furthermore, if any portion of the space between the inner and outer conductors is occupied by a gas, an additional advantage of preventing such fluid communication is that, during operation of the plasma chamber, it enables the space to remain at a much higher pressure than the vacuum within the plasma chamber. Maintaining the space at a higher pressure, such as atmospheric pressure, helps prevent gas discharge between the inner and outer conductors.

In a first aspect or embodiment of the invention, the inner conductor is positioned within the outer conductor, and there is no requirement for more than one outer conductor. In a second aspect or embodiment of the invention requiring two outer conductors, the inner conductor is positioned between the two outer conductors.

In operation, the amount of power radiated from any portion of the RF applicator increases with the number and size of the apertures in that portion and with the respective angles at which the apertures are oriented relative to the longitudinal dimension of the RF applicator.

Therefore, one advantage of the invention is that the RF applicator can be as long as desired by employing apertures that are sufficiently small and widely spaced to avoid the power propagating within the RF applicator from dropping to zero at longitudinal positions farthest from where the one or two outer conductors are connected to an RF power source.

A second advantage of the invention is that, unlike a hollow waveguide, the RF applicator does not have a cutoff frequency, hence its transverse width is not required to be greater than one-half wavelength as would be required in a hollow waveguide.

A third advantage of the invention is that, unlike an inductive coupler, the RF applicator can be operated at an RF frequency whose wavelength is shorter than the longest dimension of the portion of the RF applicator that radiates RF. In other words, the output of the RF power source can have a wavelength that is shorter than the longest dimension of the main portion of the inner conductor and is shorter than the longest dimension of the main portion of the outer conductor.

A further invention that is useful both with the aforesaid RF applicator and with other RF applicators having at least two distinct conductors is that the spatial uniformity of radiated power or the spatial uniformity of the plasma can be optimized by altering the relative sizes, spacing or orientations of apertures in different portions of the one or two outer conductors.

A further invention that is useful both with the aforesaid RF applicator and with other RF applicators having at least two distinct conductors is that the efficiency of radiation of RF power can be improved by providing an offset in a transverse or circumferential direction between apertures at successive longitudinal positions.

Within this patent application, we use the term RF to broadly include the microwave frequency range and all frequencies below.

BRIEF DESCRIPTION OF THE DRAWINGS

FIG. 10 is a cross sectional detail of a portion of the outer conductor taken through the section lines shown in FIG. 1 or FIG. 2.

FIGS. 11 and 12 are alternative embodiments of the portion of the outer conductor shown in FIG. 10.

FIGS. 14 and 15 are a side view and a perspective view of an alternative embodiment of the outer conductor having a 90-degree azimuthal offset between successive apertures.

FIGS. 16 and 17 are sectional views of the outer conductor of FIG. 14.

FIGS. 18 and 19 are a side view and a perspective view of an alternative embodiment of the outer conductor having a 60-degree azimuthal offset between successive apertures.

FIGS. 20-22 are sectional views of the outer conductor of FIG. 18.

BEST MODE FOR CARRYING OUT THE INVENTION

1. Two-Conductor RF Applicator

Figure 1:
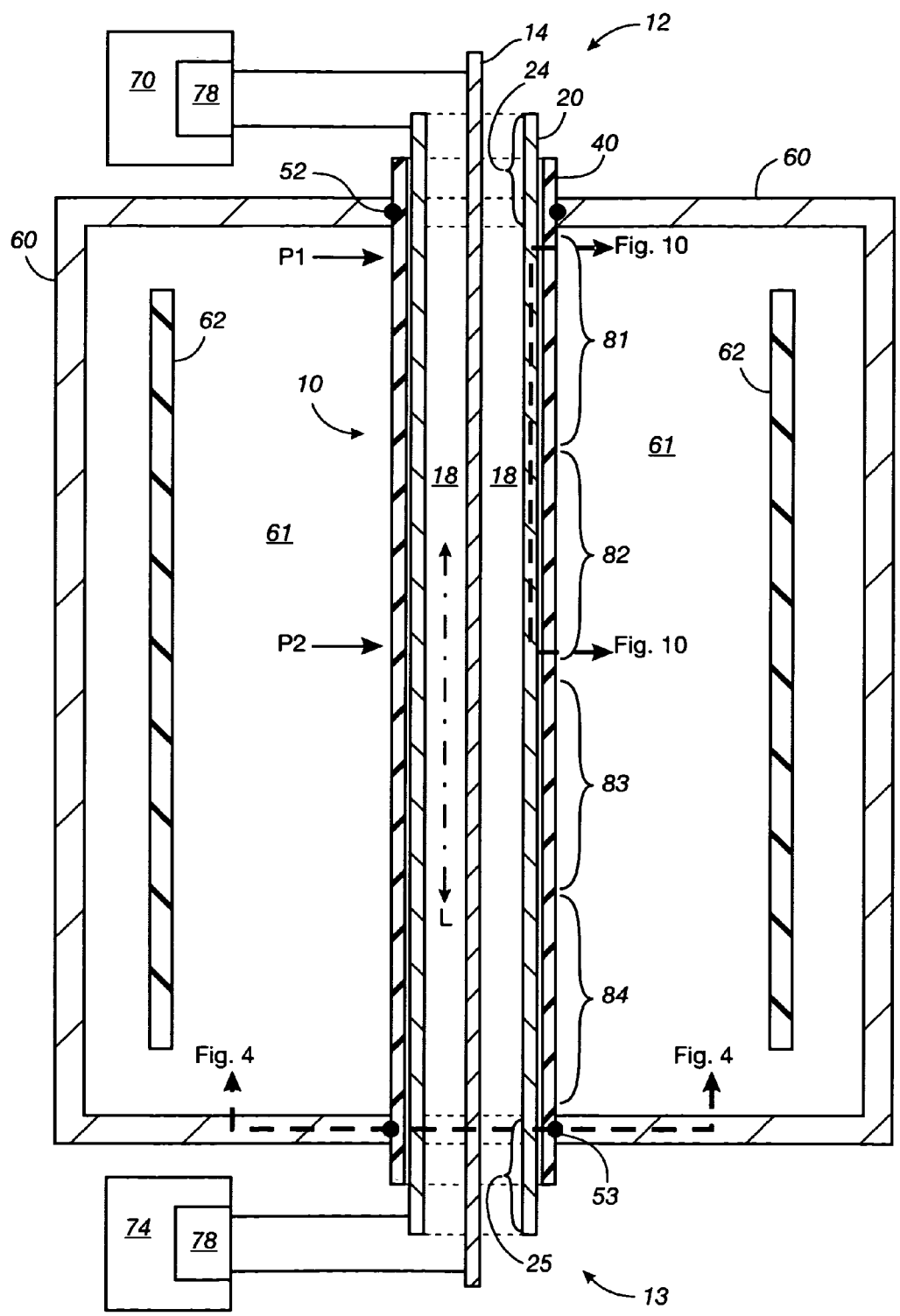
FIG. 1 is a longitudinal sectional view of a plasma chamber including a two-conductor RF applicator according to the invention, with the connection of the RF applicator to two RF power sources shown schematically.

FIGS. 1-22 illustrate various embodiments of a two-conductor transmission line RF applicator 10 according to the first aspect or first embodiment of the invention.

The RF applicator 10 includes an inner conductor 14 and an outer conductor 20. The outer conductor 20 has a main portion 21 extending between first and second end portions 24,25. Similarly, the inner conductor 14 has a main portion 15 extending between first and second end portions 16,17. The main portion 15 of the inner conductor is positioned within, and spaced away from, the main portion 21 of the outer conductor 20.

We refer to the RF applicator 10 as having opposite first and second ends 12,13, such that the first end 12 of the RF applicator is adjacent the respective first end portions 16, 24 of the inner and outer conductors, and the second end 13 of the RF applicator is adjacent the respective second end portions 17,25 of the inner and outer conductors.

The main portion 21 of the outer conductor 20 includes a plurality of apertures 30 that extend between inner and outer surfaces 22,23 of the main portion of the outer conductor. The inner surface 22 faces the main portion 15 of the inner conductor. In embodiments that include a dielectric cover 40 as explained below, the outer surface 23 of the main portion of the outer conductor faces the inner surface 44 of the main portion 41 of the dielectric cover.

In operation, when the output of an RF power source 70,74 is connected between the inner conductor 14 and the outer conductor 20, an RF electromagnetic wave propagates through the space 18 between the respective main portions 15,21 of the inner and outer conductors. A portion of the RF power in this electromagnetic wave radiates from the apertures 30, thereby radiating RF power outside the RF applicator.

If the RF applicator is within the vacuum enclosure 60 of a plasma chamber as shown in FIGS. 1-4, the RF power radiated by the RF applicator will be absorbed by the gases and plasma within the plasma chamber and thereby excite the gases to a plasma state or sustain an existing plasma.

Figure 2:
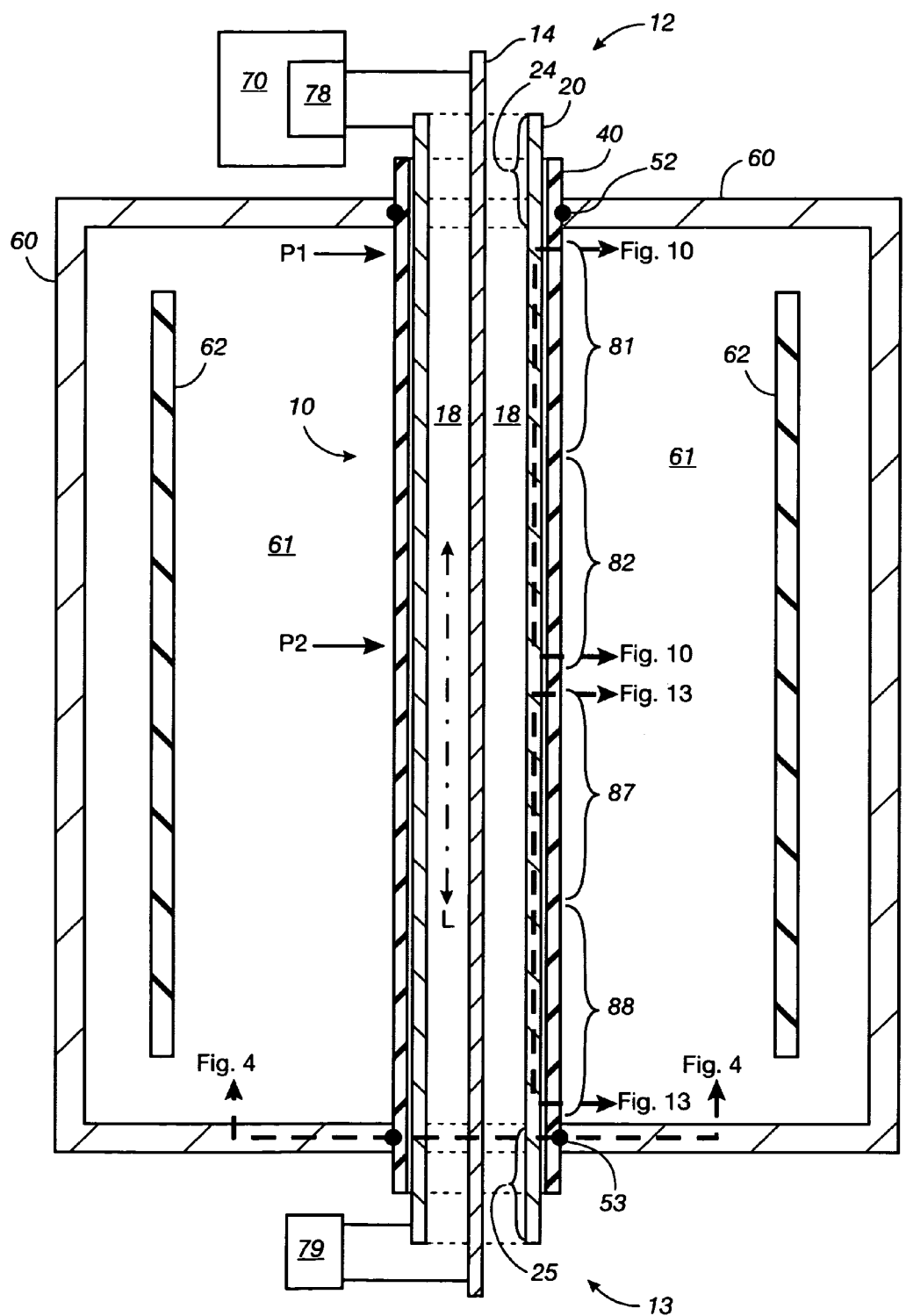
FIG. 2 is a longitudinal sectional view of an embodiment identical to FIG. 1 except having only one RF power source.
Figure 3:
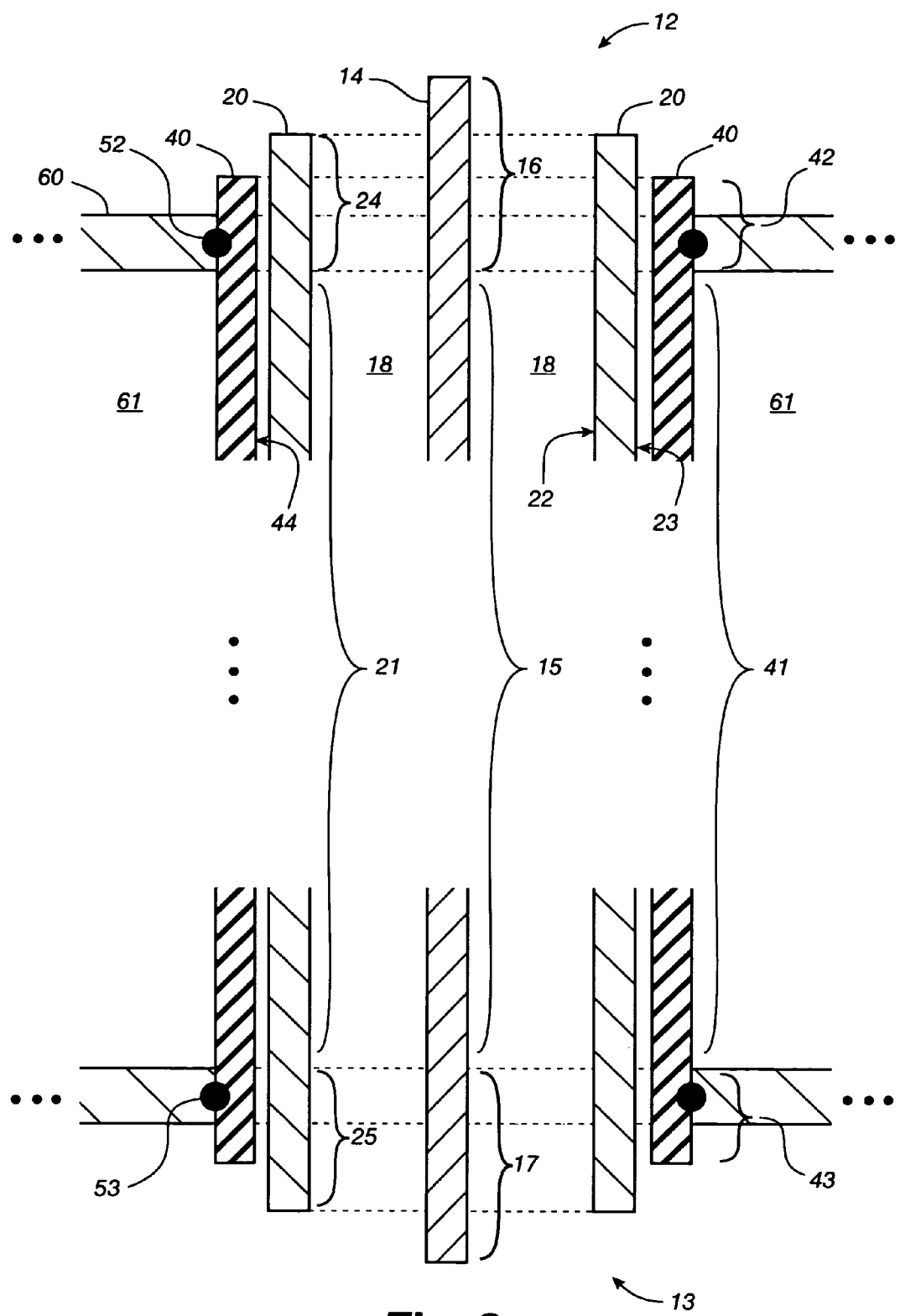
FIG. 3 is a sectional view of a detail of the first and second ends of the RF applicator of FIGS. 1 and 2.

The invention is especially advantageous for use in a plasma chamber that processes two workpieces 62 simultaneously. In that case, an RF applicator 10 according to the invention can be positioned between the two workpieces 62 within the vacuum enclosure 60 of a plasma chamber as shown in FIGS. 1 and 2 so as to provide equal plasma densities adjacent the two workpieces. Optionally, an array of multiple RF applicators 10 can be positioned within the vacuum enclosure of the plasma chamber so as to distribute the RF power over a wider area than a single RF applicator. For example, the multiple RF applicators 10 can be spaced apart within a geometric plane that is equidistant between the two workpieces.

The RF applicator preferably includes a dielectric cover 40 and first and second sealing apparatuses 52,53 to prevent plasma from entering the apertures 30. This is explained in the subsequent section of this patent specification entitled "3. Dielectric Cover and Dielectric Between Conductors".

If only one RF power source 70 is connected to the RF applicator as shown in FIG. 2, the electromagnetic wave propagating within the RF applicator will have a standing wave spatial distribution pattern in which the electric field will have alternating maxima and minima every one-fourth wavelength along the length of the RF applicator. In this standing wave pattern, the axial component of the electric field has a maximum at points where the radial component of the electric field has a minimum, and vice versa. Any apertures 30 located near a maximum of the axial electrical field standing wave pattern will radiate much more power than any apertures of the same size and orientation located near a minimum of the axial electrical field standing wave pattern.

It would be possible to position the apertures 30 only at locations of successive maxima of the axial electrical field standing wave pattern, which would occur at half-wavelength intervals along the longitudinal dimension L of the outer conductor. However, the locations of the maxima are difficult to predict because the standing wave pattern shifts as a function of operating conditions in the plasma chamber. Therefore, if only one RF power source 70 is connected to the RF applicator, it is preferable to space the apertures less than one-fourth wavelength apart along the longitudinal dimension of the outer conductor, in which case there is no need to predict the locations of the standing wave maxima.

A key difference between the invention and conventional designs that employ a slotted hollow waveguide RF applicator is that the invention has distinct inner and outer RF-powered conductors 14, 20 that can be connected to receive an RF voltage from an RF power source 70. (In other words, an RF power source can be connected to produce an RF voltage between the inner conductor 14 and the outer conductor 20.) In contrast, the waveguide of a hollow waveguide RF applicator is not RF-powered, but merely functions as an electrically conductive boundary to confine a wave propagating through the dielectric that the hollow waveguide surrounds. It is well known that a hollow waveguide has a cutoff frequency below which no wave will propagate, which requires its transverse width to exceed a certain size. Reducing the transverse width of the RF applicator is beneficial to reduce the fraction of the reagents in the plasma chamber that are consumed by surface reactions adjacent the surface of the RF applicator. A valuable advantage of the invention over slotted hollow waveguide RF applicators is that the invention does not have a cutoff frequency or a required minimum dimension.

Figure 4:
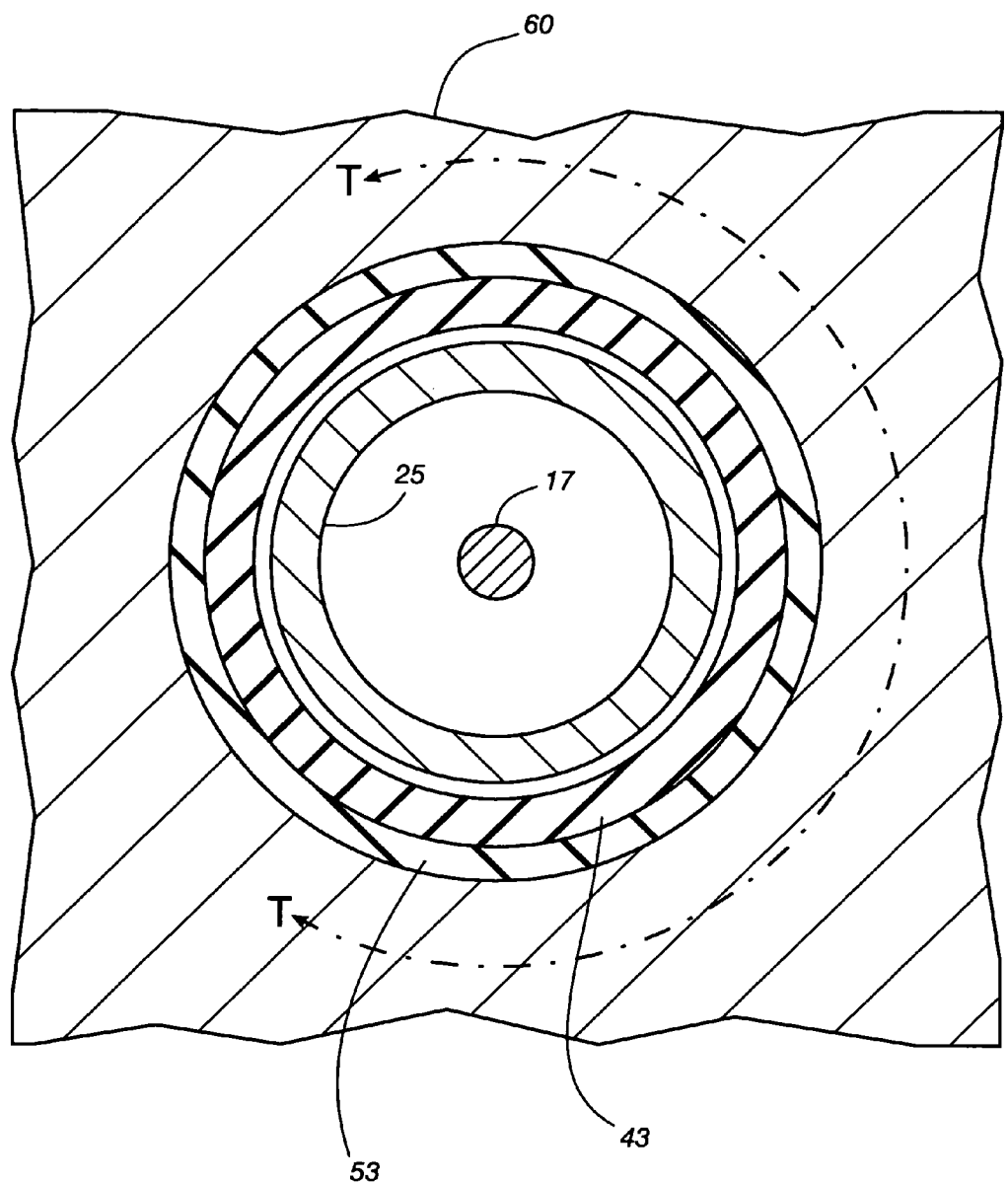
FIG. 4 is a transverse sectional view of the second end of the RF applicator of FIGS. 1 and 2 where it passes through a wall of the vacuum enclosure.
Figure 5:
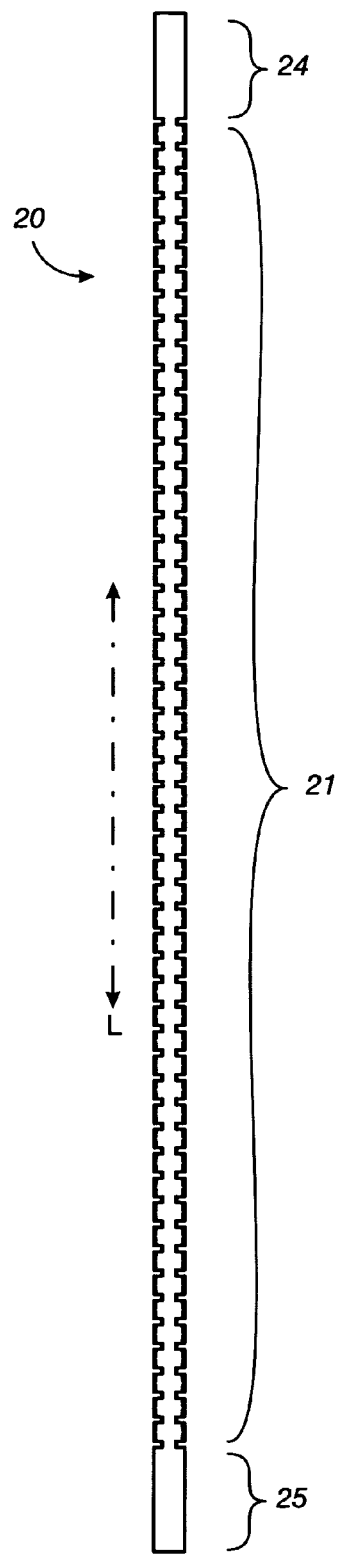
FIG. 5 is a side view of the outer conductor of FIGS. 1-4.
Figure 6:
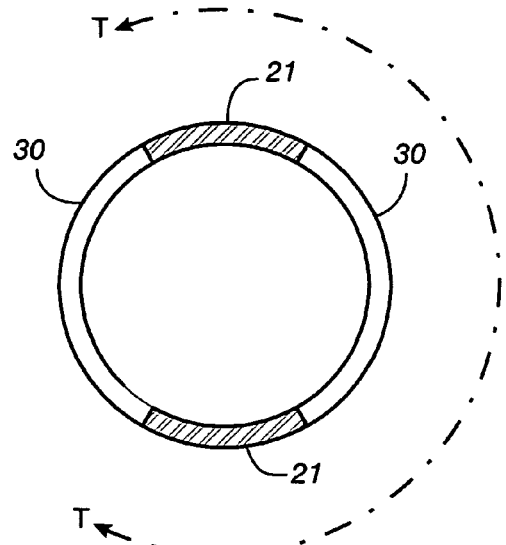
FIG. 6 is a transverse sectional view of the outer conductor of FIG. 5.
Figure 7:
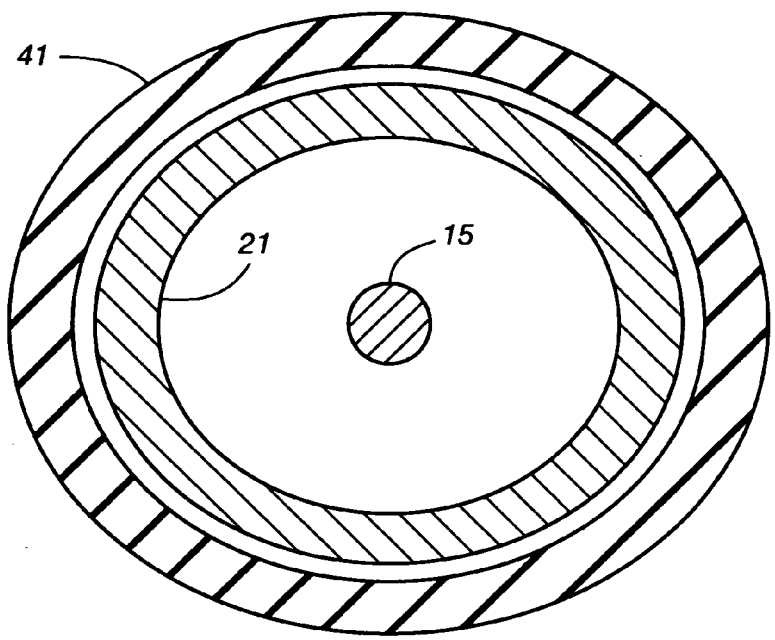
FIG. 7 is a transverse sectional view of an alternative RF applicator whose outer conductor has an elliptical cross section.
Figure 8:
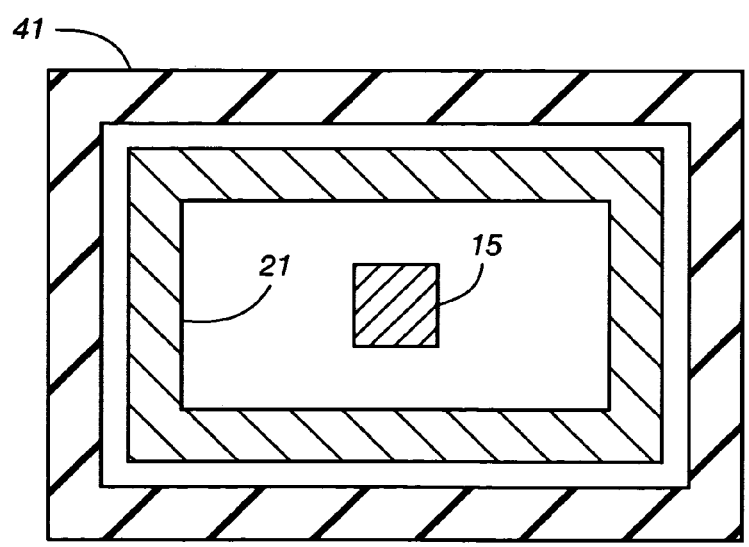
FIG. 8 is a transverse sectional view of an alternative RF applicator whose inner and outer conductors have rectangular cross sections.

The invention does not require the inner and outer conductors 14,20 to have any specific shapes. In FIGS. 4-6, the main portion 15 of the inner conductor 14 and the main portion 21 of the outer conductor 20 each have a circular cross section. FIG. 7 illustrates an alternative embodiment of an RF applicator 10 in which the main portion 21 of the outer conductor 20 has an elliptical cross section. FIG. 8 illustrates an alternative embodiment of an RF applicator 10 in which the respective main portions 15,21 of the inner and outer conductors 14,20 each have rectangular cross sections.

The inner conductor need not have the same shape as the outer conductor. For example, an RF applicator can have an inner conductor 14 that is cylindrical as in FIG. 7 in combination with an outer conductor 20 that has a rectangular cross section as in FIG. 8.

In all of the illustrated embodiments, the inner and outer conductors are positioned coaxially and are straight and tubular in shape. However, this is not a requirement of the invention. For example, the inner and outer conductors can have a curved, serpentine or zig-zag shape.

2. Connections to RF Power Source

The details of electrical connections from one or two RF power sources 70,74 to the RF applicator 10 now will be described.

In operation, a first RF power source 70 is connected to produce a first RF voltage between the inner conductor 14 and the outer conductor 20. Preferably but optionally, a second RF power source 74 is connected to produce a second RF voltage between the inner conductor 14 and the outer conductor 20.

If both RF power sources are used, preferably the RF outputs of the first and second RF power sources 70,74 are respectively connected to the first and second ends 12,13, respectively, of the RF applicator as shown in FIG. 1. If only the first RF power source is used as shown in FIG. 2, its RF output can be connected to any locations on the inner and outer conductors 14, 20.

More specifically, if both RF power sources are used as in FIG. 1, preferably the first RF power source 70 is connected to produce a first RF voltage between the first end portion 16 of the inner conductor 14 and the first end portion 24 of the outer conductor 20. Likewise, preferably the second RF power source 74 is connected to produce a second RF voltage between the second end portion 17 of the inner conductor 14 and the second end portion 25 of the outer conductor.

Alternatively, if only the first RF power source is used as in FIG. 2, its output can be connected to produce an RF voltage between any location on the inner conductor 14 and any location on the outer conductor 20. Preferably, the first RF power source is connect to the first end 12 of the RF applicator, and a termination impedance 79 is connected to the second end 13 of the RF applicator. Specifically, the first RF power source 70 preferably is connected to produce an RF voltage between the first end portion 16 of the inner conductor 14 and the first end portion 24 of the outer conductor 20. The termination impedance 79 preferably is connected between the second end portion 17 of the inner conductor 14 and the second end portion 25 of the outer conductor 20.

The termination impedance 79 can be any electrical impedance. For example, the termination impedance 79 can be an electrical short circuit or a conventional tuning plunger, and optionally it can be movable along the longitudinal dimension L of the inner and outer conductors 14, 20.

In operation, the RF power supplied by the first, and optionally second, RF power sources 70, 74 produces an electromagnetic field in the space 18 between the respective main portions 15, 21 of the inner and outer conductors 14, 20 that propagates as an RF electromagnetic wave along the length of such space 18 between the first and second ends 12, 13 of the RF applicator.

If only one RF power source 70 is connected to the inner and outer conductors as in FIG. 2, the wave propagating within the RF applicator will be a standing wave.

Alternatively, if two independent (i.e., not phase-coherent) RF power sources 70, 74 are connected to opposite end portions of the inner and outer conductors as in FIG. 1, the wave propagating within the RF applicator will be a traveling wave. In the latter case, each power source preferably includes at its output a conventional RF isolator 78 for the purpose of preventing the wave propagating from one RF power source to the opposite RF power source from being reflected back into the RF applicator, thereby preventing the creation of a standing wave within the RF applicator.

All outputs of the power sources 70,74 are shown in FIGS. 1 and 2 as floating, i.e., as not connected to electrical ground. Alternatively, one of the outputs from each power source can be electrically grounded.

When we describe an output of an RF power source 70,74 as connected to any of the conductors 14,20 of the RF applicator, the connection can be through intermediate components, such as an RF transformer, an impedance matching network, or a hollow waveguide transmission line connected between an RF power source and one or more conductors of the RF applicator. The only requirement of the invention is that the connection of the RF power source 70 or 74 to the RF applicator—with or without intermediate components—is configured such that the RF power source produces an RF voltage between the inner conductor 14 and the outer conductor 20.

To accommodate thermal expansion of the inner and outer conductors 14,20, the aforesaid electrical connection of RF power to the inner and outer conductors optionally includes conventional sliding finger contacts.

If the RF power signal produced by the RF power source 70,74 is in the microwave frequency range, a hollow waveguide can be an efficient means for connecting the output of the RF power source to the inner and outer conductors. In general, the hollow waveguide is coupled to the output of the RF power source so that the RF power produced by the RF power source propagates as an electromagnetic wave through the interior of the waveguide. The hollow waveguide is coupled to the respective first end portions 15,21 of the inner and outer conductors so that the RF wave in the waveguide produces an RF voltage between the inner conductor 14 and each outer conductor 20 of the RF applicator. Any conventional coupler for extracting an RF voltage from a hollow waveguide can be used.

It is important to emphasize that the use of a hollow waveguide to connect the output of an RF power source to the respective first end portions 15, 21 of the inner and outer conductors does not imply that the RF applicator 10 is similar to a hollow waveguide. As stated at the end of the preceding section of this patent specification entitled "1. Two-Conductor RF applicator", our RF applicator 10 has a plurality of RF-powered conductors 14, 20. In contrast, the waveguide of a hollow waveguide RF applicator is not RF-powered, but merely functions as an electrically conductive boundary to confine a wave propagating through the dielectric that the hollow waveguide surrounds. This difference is responsible for an important advantage of the invention, which is that it has no cutoff frequency and no required minimum dimension.

As stated above, an array of multiple RF applicators 10 optionally can be positioned within the vacuum enclosure of the plasma chamber. Each respective RF applicator can be connected to a distinct respective first power source 70 and, optionally, a distinct respective second power source 74. Alternatively, multiple RF applicators can be connected in parallel to the same power source. Alternatively, multiple RF applicators can be connected in series to a single power source 70 or in series between first and second power sources 70, 74. If multiple RF applicators are connected in series, then at the junction between any two of the RF applicators, each of the two RF applicators functions as a termination impedance for the other RF applicator.

3. Dielectric Cover and Dielectric Between Conductors

If the apertures 30 have a transverse width that exceeds a certain value (which is a function of chamber pressure and process gas composition), a gas discharge can form within the apertures if gas within the interior of the plasma chamber is permitted to enter the apertures. Such gas discharge would electrically short-circuit the apertures, thereby preventing the RF applicator from radiating RF power through the apertures.

To permit the use of larger apertures without risk of gas discharge within the apertures, the RF applicator 10 preferably includes a dielectric cover 40 and first and second sealing apparatuses 52,53.

The plasma chamber includes a vacuum enclosure 60 that encloses the interior 61 of the plasma chamber. The vacuum enclosure 60 includes one or more walls that collectively provide an air-tight enclosure that enables a vacuum to be maintained in the interior 61 if a vacuum pump is coupled to the interior. The dielectric cover includes a main portion 41 that extends between first and second end portions 42,43. The main portion of the dielectric cover is positioned within said interior 61 of the plasma chamber. The main portion 21 of the outer conductor 20 is positioned within the main portion 41 of the dielectric cover 40.

The first sealing apparatus 52 abuts the first end portion 42 of the dielectric cover 40, and the second sealing apparatus 53 abuts the second end portion 43 of the dielectric cover. The first and second sealing apparatuses, the dielectric cover and the vacuum enclosure 60 in combination prevent fluid communication between the main portion of the outer conductor and the interior 61 of the plasma chamber. Consequently, the dielectric cover 40 prevents gas (or plasma) within the plasma chamber from entering the apertures 30.

Typically it does not matter whether the first and second sealing apparatuses 52,53 are dielectric or conductive because they typically are not electrically coupled to the inner conductor 14 or outer conductor 20.

In the embodiments illustrated in FIGS. 1-4, the first and second end portions of the dielectric cover 40 either abut or extend through opposite sides of the vacuum enclosure 60 of the plasma chamber. These embodiments illustrate that each of the first and second sealing apparatuses 52,53 optionally can be merely a conventional O-ring. The first sealing apparatus 52 is an O-ring that extends between the first end portion 42 of the dielectric cover and the vacuum enclosure 60, and the second sealing apparatus 53 is an O-ring that extends between the second end portion 43 of the dielectric cover and the vacuum enclosure 60. Each sealing apparatus 52,53—i.e., each O-ring—provides a hermetic seal between the dielectric cover 40 and the vacuum enclosure 60. Consequently, the two O-rings, the dielectric cover and the vacuum enclosure in combination prevent fluid communication between the main portion of the outer conductor and the interior 61 of the plasma chamber.

An advantage of the O-rings 52,53 illustrated in FIGS. 1-4 is that they can accommodate thermal expansion of the dielectric cover 40 by permitting the dielectric cover to move (along the longitudinal dimension L of the dielectric cover) relative to the vacuum enclosure 60 while maintaining the hermetic seal described in the preceding paragraph.

Depending on the types of materials of which the inner and outer conductors 14,20 and the dielectric cover 40 are composed, the inner and outer conductors may have a higher thermal expansion coefficient than the dielectric cover. If so, the outer conductor preferably is mounted so that it is free to slide longitudinally within the dielectric cover, thereby accommodating thermal expansion of the outer conductor while minimizing thermal stress in the dielectric cover.

Figure 9:
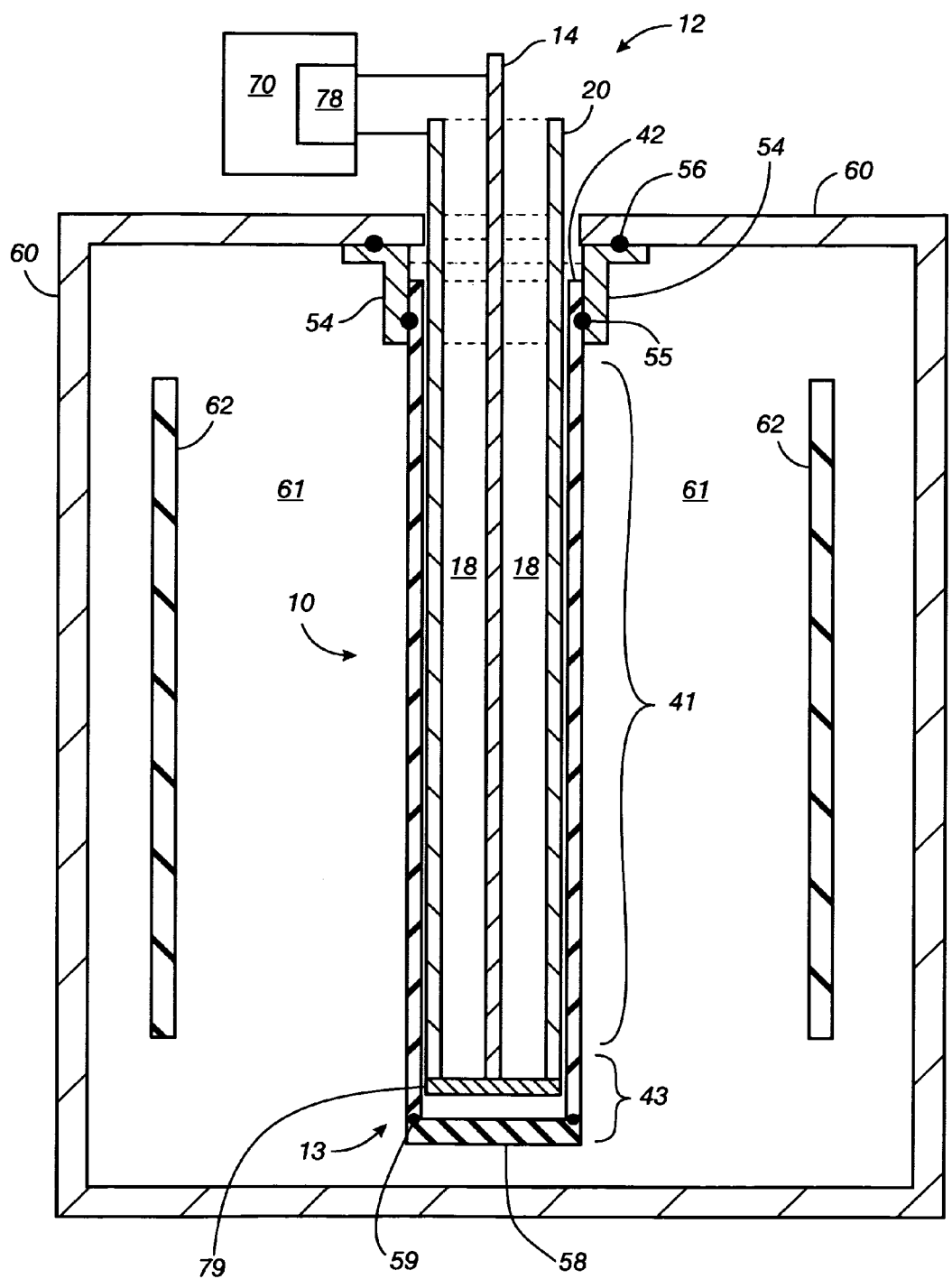
FIG. 9 is a longitudinal sectional view of a variation of the embodiment of FIG. 2 having alternative first and second sealing apparatuses.

FIG. 9 illustrates two alternative embodiments of the sealing apparatuses 52,53. The first sealing apparatus 52 includes a collar 54 and two O-rings 55,56. The first O-ring 55 provides a hermetic seal between the collar 54 and the first end portion 42 of the dielectric cover 40. The second O-ring 56 provides a hermetic seal between the collar 54 and the plasma chamber's vacuum enclosure 60. The first sealing apparatus 52—i.e., the collar 54 and the two O-rings 55,56 in combination—thereby provides a hermetic seal between the dielectric cover 40 and the vacuum enclosure 60.

FIG. 9 also illustrates an alternative design for the second end 13 of the RF applicator 10. Specifically, the termination impedance 79 is positioned within the dielectric cover 40, thereby eliminating any need for the second end portion 17 of the inner conductor 14 and the second end portion 25 of the outer conductor 20 to pass through the vacuum enclosure of the vacuum chamber (as otherwise would be required to connect to an externally located termination impedance 79 as in FIG. 2 or an externally located power source 74 as in FIG. 1). This eliminates any need for the second end portion 43 of the dielectric cover to abut or pass through the vacuum enclosure 60 of the plasma chamber.

As described above, the termination impedance 79 can be any electrical impedance. For example, the termination impedance 79 can simply be a conductor (i.e., an electrical short circuit) connected between the second end portion of the inner conductor 14 and the second end portion of the outer conductor 20 as shown in FIG. 9. Alternatively, the second end portions of the inner and outer conductors can be left open, so that the termination impedance would be an open circuit or the parasitic impedance between the second end portions of the inner and outer conductors.

Figure 24:
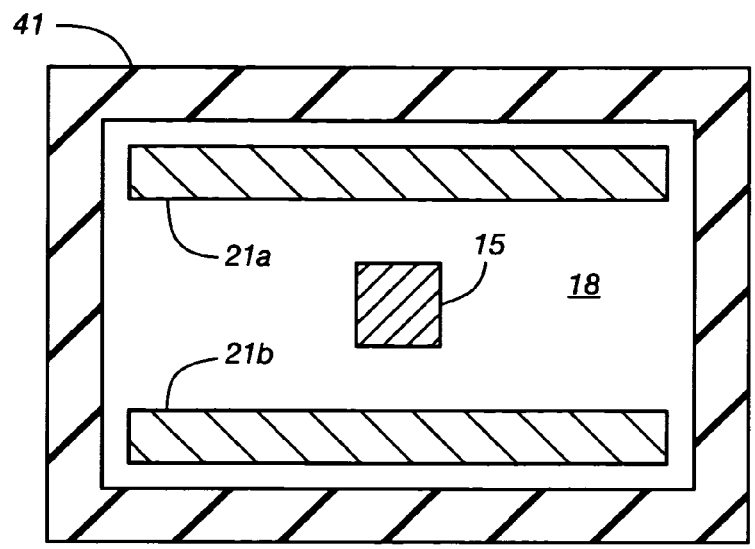
FIG. 24 is a transverse sectional view of the RF applicator of FIG. 23.

In the alternative design of FIG. 9, because the second end portion 43 of the dielectric cover does not abut or pass through the vacuum enclosure 60, the second sealing apparatus 53 can be spaced away from the vacuum enclosure 60. In the example of FIG. 24, the second sealing apparatus 53 includes a dielectric end cap 58 and an O-ring 59. The dielectric end cap 58 overlies the opening at the second end portion 43 of the dielectric cover, and the O-ring 59 provides a hermetic seal between the dielectric end cap 58 and the second end portion of the dielectric cover.

In a variation of this design (not shown), the dielectric end cap 58 can be integral and contiguous with the second end portion 43 of the dielectric cover, thereby providing the hermetic seal described in the preceding paragraph without need for the O-ring 59.

The space 18 between the main portion 15 of the inner conductor 14 and the main portion 21 of the outer conductor 20 can be occupied by any type of dielectric, which can be any combination of gas, liquid or solid dielectrics. To maximize the efficiency of the RF applicator, the dielectric occupying the space 18 preferably is a material having a low absorption of energy at the operating frequencies of the RF power sources. For example, deionized water would be a suitable dielectric at certain RF frequencies, but it would be a bad choice if the RF power source were operated at 2.4 GHz because water absorbs radiation at that frequency.

Air typically is a suitable dielectric for the space 18 between the main portion 15 of the inner conductor 14 and the main portion 21 of the outer conductor 20. Therefore, the space 18 can simply be open to ambient atmosphere, as shown in FIGS. 1-3, 9 and 23. In that case, the space 18 remains at ambient atmospheric pressure regardless of the pressure (i.e., vacuum) within the interior of the plasma chamber.

The dielectric occupying the space 18 optionally can be a fluid that is pumped through the space 18 in order to absorb heat from the inner and outer conductors 14,20. The fluid can be a liquid or a gas such as air or nitrogen. After flowing through the space 18, the fluid can be discharged outside the plasma chamber or recirculated through a heat exchanger, thereby cooling the RF applicator. Such cooling is beneficial because the dielectric cover 40 is heated by the plasma in the plasma chamber, and heat flows from the dielectric cover to the outer conductor 20. In addition, the inner conductor 14 is heated by resistive heating caused by RF current flow through the inner conductor.

The inner conductor 14 can be solid or hollow. If it is hollow, additional cooling of the inner conductor can be provided by pumping a coolant fluid such as water through its hollow interior. There is essentially no RF field in the interior of the inner conductor, so the electrical properties of this coolant fluid are unimportant.

If the space 18 is occupied by a fluid as just described, it may be desirable to stabilize the position of the inner conductor 14 relative to the outer conductor 20 by mechanically connecting one or more support members (not shown) between the inner conductor 14 and the outer conductor 20. The support members preferably are a dielectric material such as PTFE (polytetrafluoroethene). Alternatively, the support members can be electrically conductive if the support members have a small transverse width, thereby minimizing the disruption of the electromagnetic field within the space 18 by the electrical conductivity of the support members.

If the space 18 between the inner and outer conductors is occupied by a gas, it is desirable to avoid any gas discharge in the space 18 in order to maximize the efficiency and uniformity of the radiation of RF power from the RF applicator. The maximum level of RF power that can be supplied by the RF power sources 70,74 without causing such gas discharge increases with the pressure of the gas within the space 18. Therefore, it is desirable to maintain the gas within the space 18 at a pressure (such as atmospheric pressure) that is much higher than the very low pressure within the plasma chamber.

As explained above, the first and second sealing apparatuses 52,53 abut the dielectric cover 40 such that the sealing apparatuses, the dielectric cover and the vacuum enclosure 60 in combination prevent fluid communication between the main portion 21 of the outer conductor and the interior 61 of the plasma chamber. Consequently, the sealing apparatuses 52,53, the dielectric cover 40 and the vacuum enclosure 60 in combination provide a gas-tight seal between said space and the interior of the plasma chamber so as to enable a pressure differential between said space and the interior of the plasma chamber. This combination 52,53,40,60 thereby enables the gas within the space 18 to be be maintained at a pressure (such as atmospheric pressure) that is much higher than the very low pressure within the interior of the plasma chamber. Such higher pressure can be established, for example, by coupling the space 18 to a gas pump or by providing an opening from the space 18 to the ambient atmosphere, as shown in FIGS. 1 and 2, so that the space 18 remains at ambient atmospheric pressure regardless of the pressure within the interior of the plasma chamber.

4. Optimizing Spatial Distribution of RF Radiation

In the following discussion, we define the "longitudinal dimension" of the outer conductor as the dimension of the outer conductor that extends between the first end portion 24 and the second end portion 25, regardless of whether the outer conductor is straight or curved, and regardless of whether the transverse cross section of the outer conductor is rectangular, circular, elliptical, or any other shape. We use the terms "circumferential dimension" and "transverse dimension" to mean a dimension along the outer surface 23 of the outer conductor that is perpendicular (i.e., transverse) to the longitudinal dimension of the outer conductor. The longitudinal dimension is illustrated by the axis L in FIGS. 1,2,5 and 10-13. The circumferential dimension (or, equivalently, the transverse dimension) is illustrated by the axis T in FIGS. 4,6 and 10-13.

One advantage of the invention is that the spatial uniformity of the RF power radiated from the RF applicator 10, or the spatial uniformity of the plasma produced thereby, can be optimized by altering the relative sizes, spacing or orientations of apertures 30 in different portions of the main portion 21 of the outer conductor 20.

One reason this is advantageous is that the RF electromagnetic wave propagating through the space 18 between the respective main portions 15, 21 of the inner and outer conductors has a longitudinal non-uniformity in power density. Specifically, the RF power density within the space 18 decreases progressively with distance along the longitudinal dimension L of the RF applicator from the one or more points on the inner and outer conductors at which they are connected to an RF power source 70, 74.

For example, in the embodiment of FIG. 1 in which opposite ends 12, 13 of the RF applicator 10 are connected to receive power from two RF power sources 70, 74, the RF power density within the space 18 is maximum near the two ends 12, 13 of the RF applicator and progressively declines along the longitudinal dimension L to a minimum at the center of the RF applicator. As another example, in the embodiment of FIG. 2 in which only the first end 12 of the RF applicator is connected to an RF power source 70 (and the second end 13 of the RF applicator preferably is connected to a termination impedance 79), the RF power density within the space 18 is maximum near the first end 12 of the RF applicator, progressively declines along the longitudinal dimension toward the center of the RF applicator, and further progressively declines along the longitudinal dimension from the center to a minimum near the second end 13 (i.e., the opposite end) of the RF applicator.

To improve the spatial uniformity of RF power radiated by the RF applicator 10, this longitudinal progressive decline in RF power density within the space 18 between the respective main portions 15, 21 of the inner and outer conductors can be offset by a corresponding longitudinal progressive increase in the fraction of RF power that is radiated through the apertures 30 in the outer conductor. This can be accomplished if successive apertures at progressively increasing longitudinal distance from an end of the outer conductor that is connected to an RF power source have either or both of: (1) a monotonically increasing fraction of the surface area of the outer conductor that is occupied by the successive apertures, such as by (i) monotonically increasing the area of each successive aperture, or (ii) monotonically decreasing the spacing between successive apertures; or (2) a monotonically increasing angle between the long axis of the respective aperture and the transverse or circumferential dimension T of the outer conductor (or, equivalently, a monotonically decreasing angle between the long axis of the respective aperture and the longitudinal dimension L of the outer conductor).

The effect of the angle of the apertures described in the preceding paragraph can be understood as follows. Within the main portion 21 of the outer conductor 20, the direction of electric current flow is essentially along the path between the first end portion 24 (connected to the first power source 70) and the second end portion 25 (connected either to the second power source 74, or, if there is no second power source, preferably to a termination impedance 79). Therefore, the electric field within each aperture 30 is oriented essentially parallel to the longitudinal dimension L of the outer conductor.

Consequently, the RF power radiated through an individual aperture 30 increases by a greater amount in response to increasing the width of that aperture along the longitudinal dimension L in comparison with increasing the width of that aperture along the circumferential or transverse dimension T. Therefore, if one or more apertures 30 have a non-circular cross-section, the amount of RF power radiated through the apertures will increase as the orientation of the apertures is changed so as to increase the angle between the long axis of each aperture and the longitudinal dimension L of the outer conductor, or, equivalently, so as to decrease the angle between the long axis of each aperture and the circumferential or transverse dimension T of the outer conductor.

In the embodiment of FIG. 1 in which opposite ends 12, 13 of the RF applicator 10 are connected to receive power from two RF power sources 70, 74, the RF power density within the space 18 is maximum near the two ends 12, 13 of the RF applicator and is minimum at the center of the RF applicator, as stated above. Therefore, the aforesaid monotonic change in the orientation, area or spacing of successive apertures (i.e., increasing angle between the long axis of successive apertures and the transverse or circumferential dimension T of the outer conductor, increasing area of successive apertures, decreasing spacing between successive apertures, or otherwise increasing fraction of the surface area of the outer conductor that is occupied by the apertures) preferably should progress from either end of the main portion 21 of the outer conductor toward the center of the outer conductor.

In the embodiment of FIG. 2 in which only the first end 12 of the RF applicator is connected to an RF power source 70, the RF power density within the space 18 is maximum near the first end 12 of the RF applicator, is minimum at the second end 13 (i.e., the opposite end) of the RF applicator, and has an intermediate value at the center of the RF applicator. Therefore, the aforesaid progressive change in the orientation, area or spacing of successive apertures preferably should progress from the first end of the main portion 21 of the outer conductor toward the center of the outer conductor, and preferably further progress from the center toward the second end of the main portion of the outer conductor.

Figure 12:
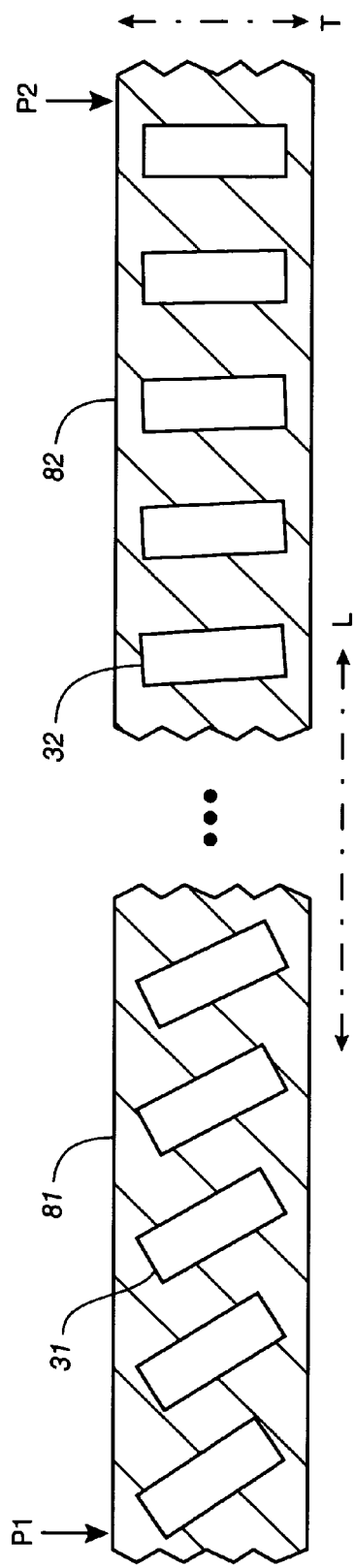

In summary, regardless of whether the RF applicator is connected to an RF power source at both first and second ends 12, 13 as in the FIG. 1 embodiment or at only one end 12 as in the FIG. 2 embodiment, the foregoing designs for improving the spatial uniformity of RF power radiated by the RF applicator 10 can be characterized as follows in terms of a plurality of apertures 30 at successive positions progressing from a first position P1 to a second position P2 on the main portion 21 of the outer conductor. The first and second positions are defined such that the first position P1 is between the second position P2 and the first end portion 24 of the outer conductor, and the second position P2 is between the first position P1 and the center of the outer conductor. In one embodiment, each respective aperture at said respective positions progressing from the first position P1 to the second position P2 has a monotonically increasing area (FIGS. 10 and 11). Alternatively, each respective aperture at said respective positions progressing from the first position P1 to the second position P2 has a monotonically decreasing spacing between adjacent apertures (FIG. 10). Alternatively, each respective aperture at said respective positions progressing from the first position P1 to the second position P2 has a long axis at a monotonically decreasing angle relative to the circumferential or transverse dimension T of the outer conductor or, equivalently, has a long axis at a monotonically increasing angle relative to the longitudinal dimension L of the outer conductor (FIG. 12).

A reason that the variation in area, spacing and angle of the apertures is described above as "monotonic" rather than progressive is to reduce the cost of manufacturing the apertures. It is relatively expensive to manufacture a conductor in which every aperture has a different size, spacing or orientation. The desired longitudinal uniformity in radiated RF power can be achieved if the variation in the apertures is step-wise rather than continuously progressive. Specifically, a progressive change in the area, spacing or angle of the apertures can be successfully approximated if several consecutive apertures have the same area, spacing and angle, and then the next several consecutive apertures have the desired change in area, spacing or angle.

Alternatively, a spatial variation in the apertures that improves the spatial uniformity of RF power radiated by the RF applicator 10 can be defined in terms of differences between the orientation, area or spacing of apertures in different portions of the main portion 21 of the outer conductor 20.

(To avoid the awkward expression "portion of a portion", in the following discussion we use the term "sub-portion" to refer to a portion of the main portion 21 of the outer conductor 20. However, the term "sub-portion" is not intended to have a different meaning from "portion". The sub-portions need not, and typically do not, have physical boundaries. The sub-portions are merely different portions of the outer conductor. Furthermore, even for a particular embodiment of an RF applicator, the boundary between the first and second sub-portions defined below is not uniquely determined, but can be considered to have any location for which the relationships defined below between the first and second plurality of apertures are fulfilled.)

FIG. 1 shows the main portion 21 of the outer conductor 20 being conceptually divided into four contiguous sub-portions labeled 81, 82, 83, 84 extending, in that order, from the first end portion 24 to the second end portion 25 of the outer conductor. As stated in the preceding paragraph, the four sub-portions need not, and typically do not, have physical boundaries. The first sub-portion 81 extends between the second sub-portion and the first end portion 24. The second sub-portion 82 extends between the second sub-portion and the center of the outer conductor. The positions of the third and fourth sub-portions 83,84 are mirror images of the second and first sub-portions, respectively. In other words, the fourth sub-portion 84 extends between the third sub-portion and the second end portion 25. The third sub-portion 83 extends between the fourth sub-portion and the center of the outer conductor.

FIG. 2 shows first, second, third and fourth sub-portions 81,82,87,88 that are defined identically to the corresponding first, second, third and fourth sub-portions 81,82, 83,84 of FIG. 1. The third and fourth sub-portions 87,88 are numbered differently in FIG. 2 for reasons that will be explained later.

(In FIGS. 1 and 2, the braces representing the longitudinal length of sub-portions 81-84 and 87-88 are located in the drawings adjacent the dielectric cover 40. This is because there is no room in the drawings to locate the braces closer to the outer conductor 20. However, the braces are intended to point to the outer conductor 20 that is immediately behind the dielectric cover 40.)

The apertures 30 within the first and second sub-portions 81,82 are respectively referred to as the first plurality of apertures 31 and the second plurality of apertures 32.

FIGS. 10-12 are detail views of opposite ends of the first and second sub-portions 81,82, in other words, the end of the first sub-portion 81 that is closest to the first end portion 24 of the outer conductor and the end of the second sub-portion 82 that is closest to the center of the outer conductor. The detail views of FIGS. 10-12 are magnified to show the differences between the area, spacing or orientation of the first and second plurality of apertures 31,32.

In both the FIG. 1 embodiment that is connected to RF power at both ends 12,13 of the RF applicator and the FIG. 2 embodiment that is connected to RF power at only one end 12, the RF power density within the space 18 between the respective main portions 15, 21 of the inner and outer conductors declines progressively from the first end 12 to the center of the RF applicator as stated above. To offset this longitudinal progressive decline in RF power density within the space 18 and thereby improve the spatial uniformity of RF power radiated by the RF applicator 10, the apertures 30 preferably are non-uniform in orientation, area or spacing in accordance with either or both of the following techniques.

In the first technique (FIGS. 10 and 11), the fraction of the surface area of the second sub-portion 82 of the outer conductor that is occupied by the second plurality of apertures 32 is larger than the fraction of the surface area of the first sub-portion 81 of the outer conductor 20 that is occupied by the first plurality of apertures 31. One possible implementation of the first technique is that the second plurality of apertures 32 have a larger area, either individually or on average, than the first plurality of apertures 31 (FIGS. 10 and 11). In the embodiment of FIG. 10, the second plurality of apertures (in the second sub-portion 82) are larger in area than the first plurality of apertures (in the first sub-portion 81) because they are wider in the longitudinal dimension L of the outer conductor. In the embodiment of FIG. 11, the second plurality of apertures are larger in area than the apertures in first sub-portion because they are wider in the transverse or circumferential dimension T of the outer conductor. An alternative implementation of the first technique is that the second plurality of apertures 32 have a smaller spacing between adjacent apertures, either individually or on average, than the first plurality of apertures (FIGS. 10 and 11).

In the second technique (FIG. 12), each respective aperture 30 is characterized by a respective angle at which its respective long axis is oriented relative to the transverse or circumferential dimension T of the second conductor, and such angles, either individually or on average, for the second plurality of apertures 32 (in the second sub-portion 82) are smaller than such angles, either individually or on average, for the first plurality of apertures 31 (in the first sub-portion 81).

Equivalently, the second technique can be defined relative to the longitudinal dimension L of the second conductor rather than the circumferential dimension T. Considering the angle at which the long axis of each aperture is oriented relative to such longitudinal dimension L, such angles, either individually or on average, for the second plurality of apertures 32 (in the second sub-portion 82) are larger than such angles, either individually or on average, for the first plurality of apertures 31 (in the first sub-portion 81).

The third and fourth sub-portions of the main portion 21 of the outer conductor 20—labeled 83,84 in FIGS. 1 and 87,88 in FIG. 2—now will be discussed.

In the embodiment of FIG. 1, each of the first and second ends 12,13 of the RF applicator is connected to a respective RF power source 70,74. Consequently, for purposes of our techniques for optimizing spatial distribution of RF radiation from the RF applicator, the second end of the RF applicator can be considered to be a mirror image of the first end. Therefore, all preceding statements regarding the area, spacing or angular orientation of the apertures in the first and second sub-portions 81,82 can be applied to the fourth and third sub-portions 84,83, respectively. In other words, in the techniques described above for improving the spatial uniformity of the RF power radiated by the RF applicator 10, every reference to the first sub-portion 81 can be replaced by a reference to the fourth sub-portion 84, and every reference to the second sub-portion 82 can be replaced by a reference to the third sub-portion 83. In particular, the respective embodiments of FIGS. 10-12 also apply if the first and second sub-portions 81 and 82 are replaced by the fourth and third sub-portions 84 and 83, respectively.

In the embodiment of FIG. 2, only the first end 12 of the RF applicator is connected to an RF power source 70. (The second end 13 of the RF applicator preferably is connected to a termination impedance 79.) As stated above, the RF power density within the space 18 between the respective main portions 15,21 of the inner and outer conductors is maximum near the first end 12 of the RF applicator, progressively declines along the longitudinal dimension toward the center of the RF applicator, and further progressively declines along the longitudinal dimension from the center to a minimum near the second end 13 (i.e., the opposite end) of the RF applicator. Consequently, for purposes of our techniques for optimizing spatial distribution of RF radiation from the RF applicator, the relationship between the second end and the center is similar to the relationship between center and the first end. Therefore, all preceding statements regarding the area, spacing or angular orientation of the apertures in the first sub-portion 81 relative to the second sub-portion 82 can be applied to the third sub-portion 87 relative to the fourth sub-portion 88.

Figure 13:
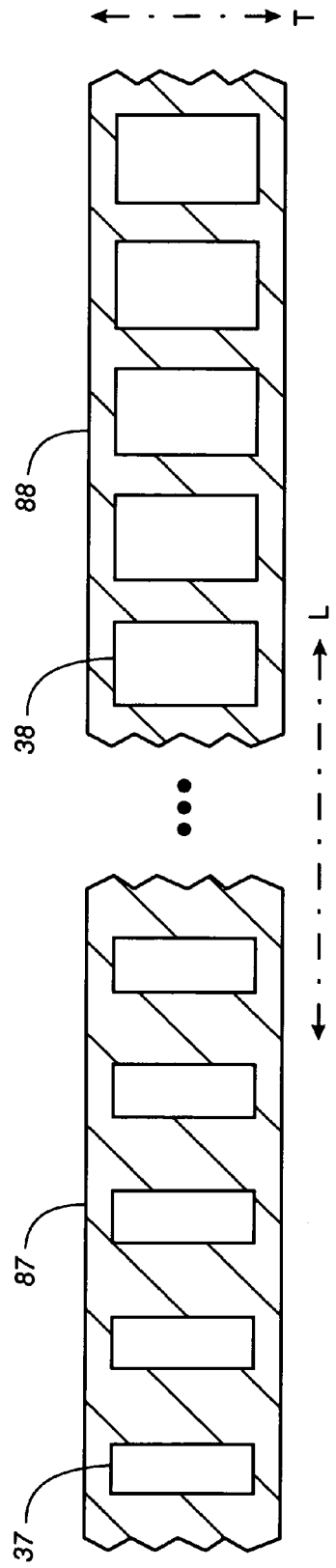
FIG. 13 is a cross sectional detail of a portion of the outer conductor taken through the section lines shown in FIG. 2.

In particular, in applying the first technique defined above, the fraction of the surface area of the fourth sub-portion 88 of the outer conductor 20 that is occupied by the fourth plurality of apertures 38 is larger than the fraction of the surface area of the third sub-portion 87 of the outer conductor that is occupied by the third plurality of apertures 37 (FIGS. 2 and 13). In applying the second technique, each respective aperture is characterized by a respective angle at which its respective long axis is oriented relative to the transverse or circumferential dimension T of the second conductor, and such angles, either individually or on average, for the third plurality of apertures 37 (in the third sub-portion 87) are smaller than such angles, either individually or on average, for the fourth plurality of apertures 38 (in the fourth sub-portion 88).

It must be emphasized that the non-uniformity of the sizes, spacings or orientations of the apertures as just described is an optional feature of the RF applicator invention, not a requirement. For example, the sizes, spacings and orientations of the apertures can be uniform as shown in FIGS. 5-6 and 14-22.

Furthermore, the non-uniformity of the sizes, spacings or orientations of the apertures as just described can be beneficial to improve the spatial uniformity of RF power radiated by two-conductor RF applicator designs other than the novel RF applicator described in this patent specification. Therefore, the techniques described in this section entitled "4. Optimizing Spatial Distribution of RF Radiation" are a useful invention independent of the other aspects of the RF applicator design.

5. Circumferential or Transverse Offset Between Apertures

Because each aperture 30 imposes a higher impedance to electrical current than the conductive material surrounding the aperture, the electrical current flowing through the outer conductor 20 will tend to bypass the apertures if there is a straight path for current flow along the longitudinal dimension L of the outer conductor that is not interrupted by any apertures, as in the embodiment of FIGS. 5 and 6. This would undesirably reduce the electric field in the apertures and thereby reduce the amount of RF power radiated from the apertures.

(This problem would not be significant in the limited situation in which all the apertures are very narrow and are oriented parallel to the longitudinal dimension L of the outer conductor, because such apertures would impose a relatively small impedance to current flow along the longitudinal dimension L of the outer conductor. However, apertures with such orientation would radiate an undesirably low amount of RF power for the reasons explained in the preceding section of this patent specification entitled "4. Optimizing Spatial Distribution of RF Radiation".)

The embodiments of FIGS. 14-22 illustrate that apertures 30 at successive positions along the longitudinal dimension L of the outer conductor 20 can be offset from each other in the transverse or circumferential dimension T of the outer surface 23 of the outer conductor, i.e., in the dimension along the outer surface of the outer conductor 20 that is orthogonal to the longitudinal dimension L. Such transverse or circumferential offset can achieve the desired result of precluding a straight path for current flow along the longitudinal dimension L of the outer conductor that is not interrupted by any apertures.

FIGS. 14-17 illustrate an embodiment in which each successive aperture along the longitudinal dimension L of the outer conductor has a circumferential offset of 90 degrees relative to the preceding aperture. FIGS. 16 and 17 are cross sectional views taken through two successive apertures along the longitudinal dimension L of the outer conductor.

FIGS. 18-22 illustrate an alternative embodiment in which each successive aperture along the longitudinal dimension L of the outer conductor has a circumferential offset of 60 degrees relative to the preceding aperture. FIGS. 20-22 are cross sectional views taken through three successive apertures along the longitudinal dimension L of the outer conductor.

The transverse or circumferential offset of the apertures as just described can be beneficial to improve the efficiency of two-conductor RF applicator designs other than the novel RF applicator described in this patent specification. Therefore, the techniques described in this section entitled "5. Circumferential or Transverse Offset between Apertures" are a useful invention independent of the other aspects of the RF applicator design.

6. Three-Conductor RF Applicator

Figure 23:
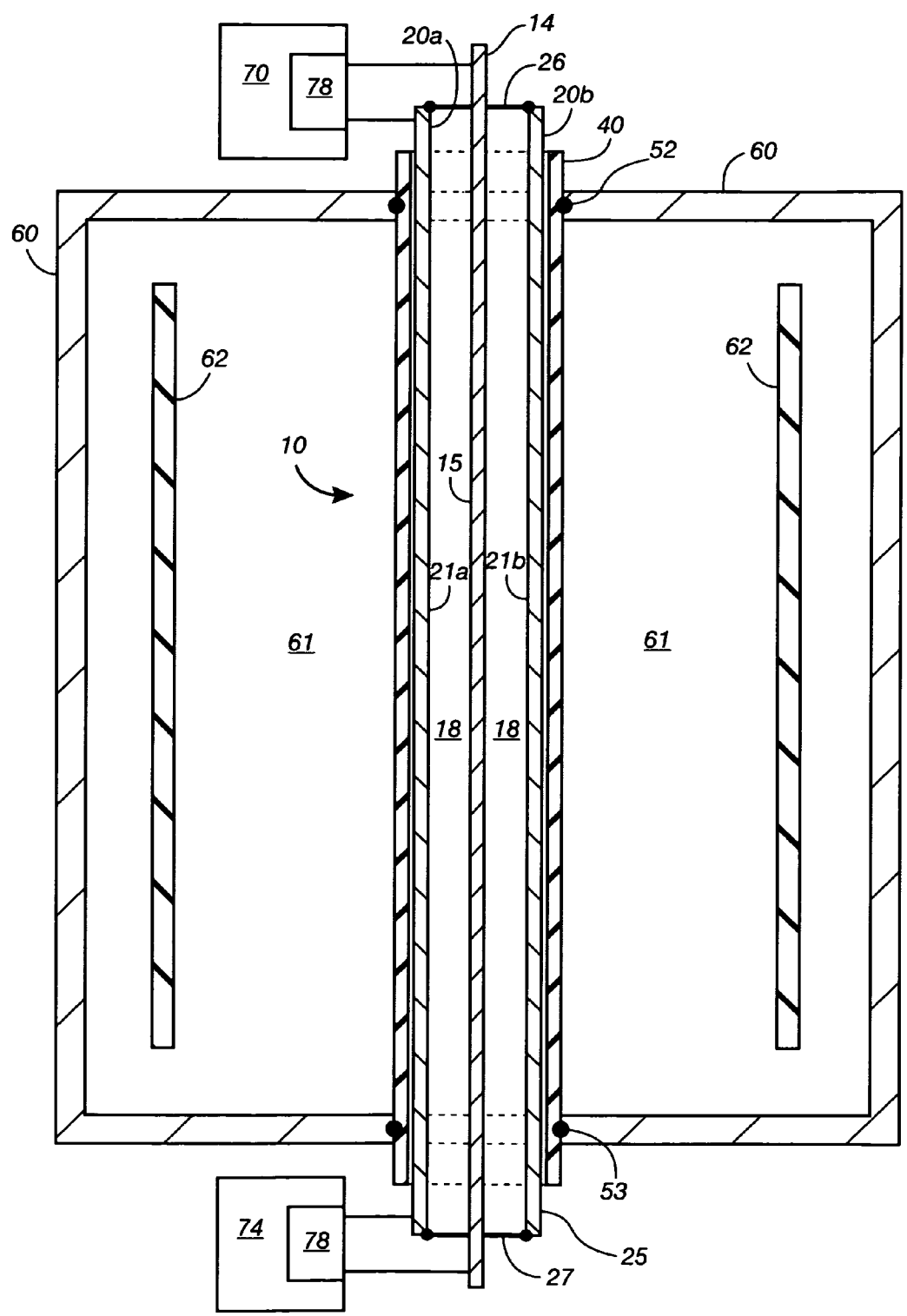
FIG. 23 is a longitudinal sectional view of a plasma chamber including a three-conductor RF applicator according to the invention, with the connection of the RF applicator to two RF power sources shown schematically.

FIGS. 23 and 24 illustrate a transmission line RF applicator 10 according to the second aspect or second embodiment of the invention that includes an inner conductor 14 and two outer conductors. We refer to the two outer conductors individually as the first outer conductor 20a and the second outer conductor 20b, and we refer to them collectively as the two outer conductors 20.

The inner conductor 14 has a main portion 15 extending between first and second end portions 16,17. Each respective outer conductor 20a, 20b has a respective main portion 21a, 21b extending between first and second end portions 24,25. (These definitions of the respective main portions and end portions are the same as for the first aspect or first embodiment of the invention shown in FIGS. 1-6 and described in the preceding section of this patent specification entitled "1. Two-Conductor RF applicator", so they are not labeled in FIG. 23.)

We refer to the RF applicator 10 as having opposite first and second ends 12,13, such that the first end 12 of the RF applicator is adjacent the respective first end portions 16, 24 of the inner and outer conductors, and the second end 13 of the RF applicator is adjacent the respective second end portions 17,25 of the inner and outer conductors.

The main portion 15 of the inner conductor is positioned between, and spaced away from, the respective main portions 21a, 21b of the first and second outer conductors 20a, 20b. The respective first end portions 24 of each of the two outer conductors 20 are electrically connected together (shown schematically in FIG. 23 by first electrical connection 26). Likewise, the respective second end portions 25 of each of the two outer conductors are electrically connected together (shown schematically in FIG. 23 by second electrical connection 27).

Optionally but preferably, the main portions of the inner and outer conductors are arranged symmetrically such that the main portion 15 of the inner conductor 14 is midway between the respective main portions 21 of the two outer conductors 20, and the respective main portions of the two outer conductors are either identical or are mirror images of each other, by which we mean they are symmetrical relative to the main portion of the inner conductor.

The main portion 21a, 21b of each respective outer conductor 20a, 20b includes a plurality of apertures 30 that extend between the respective inner and outer surfaces 22,23 of the respective main portion of the respective outer conductor. The inner surface 22 faces the main portion 15 of the inner conductor. In embodiments that include a dielectric cover 40 as described above under the heading "3. Dielectric Cover and Dielectric Between Conductors", the outer surface 23 of the main portion of each respective outer conductor 21a, 21b faces the inner surface 44 of the main portion 41 of the dielectric cover.

In operation, when the output of an RF power source 70,74 is connected between the inner conductor 14 and the two outer conductors 20, an RF electromagnetic wave propagates through the space 18 between the main portions 15,21 of the inner and outer conductors. A portion of the RF power in this electromagnetic wave radiates from the apertures 30, thereby radiating RF power outside the RF applicator.

If the RF applicator 10 is within the vacuum enclosure 60 of a plasma chamber as shown in FIG. 23, the RF power radiated by the RF applicator will be absorbed by the gases and plasma within the plasma chamber and thereby excite the gases to a plasma state or sustain an existing plasma.

The invention is especially advantageous for use in a plasma chamber 60 that processes two workpieces simultaneously. Because the respective main portions 21 of the two outer conductors 20 face opposite directions, the RF applicator 10 radiates RF power with a bidirectional radiation pattern. Therefore, an RF applicator 10 according to the invention can be positioned between two workpieces 62 within a plasma chamber 60 as shown in FIG. 23 so as to provide equal plasma densities adjacent the two workpieces.

As in the previously discussed embodiments of FIGS. 1-22, multiple RF applicators 10 according to the present embodiment having two outer conductors 20a, 20b can be positioned within the vacuum enclosure of the plasma chamber so as to distribute the RF power over a wider area than a single RF applicator. For example, the multiple RF applicators 10 can be spaced apart within a geometric plane that is equidistant between the two workpieces.

In addition to radiating RF power through the apertures 30 as described above, the RF applicator 10 will radiate RF power through the open sides between the two outer conductors if the transverse width of the main portion of each outer conductor is comparable to or less than the spacing between the respective main portions of the two outer conductors. Conversely, RF radiation in this direction will be minimal if the transverse width of the main portion of each outer conductor is at least two times the spacing between the respective main portions of the two outer conductors. This is preferred to facilitate control of the spatial distribution of the RF radiation as described in the preceding section of this patent specification entitled "4. Optimizing Spatial Distribution of RF Radiation".

The RF applicator preferably includes a dielectric cover 40 and first and second sealing apparatuses 52, 53 to prevent plasma from entering the apertures 30. Specifically, the main portion 41 of the dielectric cover is positioned within the interior 61 of the plasma chamber, and the respective main portions 21 of each of the outer conductors are positioned within the main portion 41 of the dielectric cover. The first and second sealing apparatuses 52, 53 respectively abut the first and second end portions 42, 43 of the dielectric cover. The first and second sealing apparatuses, the dielectric cover and the vacuum enclosure 60 in combination prevent fluid communication between the interior of the plasma chamber and the respective main portions of the first and second outer conductors. Further details regarding the dielectric cover and sealing member are the same as explained in the preceding section of this patent specification entitled "3. Dielectric Cover and Dielectric Between Conductors".

Figure 25:
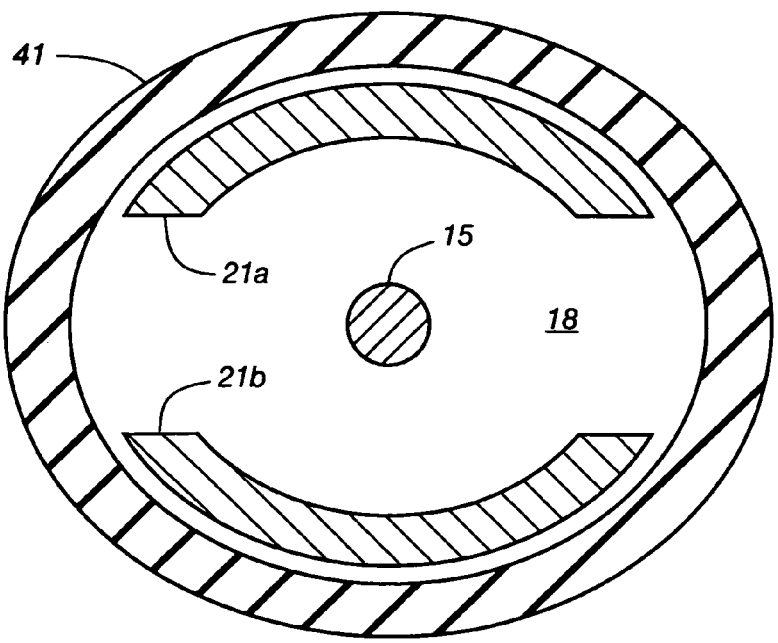
FIG. 25 is a transverse sectional view of a modification of the RF applicator of FIG. 23 wherein each outer conductor has an arcuate cross section.

The invention does not require the inner and outer conductors 14, 20 to have any specific shapes. In FIGS. 23 and 24, the main portion 15 of the inner conductor is illustrated as having a rectangular cross section, but it alternatively can have a circular cross section as shown in FIG. 25. In FIGS. 23 and 24, the main portion 21a, 21b of each of the two outer conductors is illustrated as having a rectangular cross section. FIG. 25 illustrates an alternative design in which the main portion 21a, 21b of each outer conductor has an arcuate cross section, and the main portion 41 of the dielectric cover 40 has an elliptical cross section.

The features, design considerations, and advantages of the invention described above under the headings "2. Connections to RF Power Source", "3. Dielectric Cover and Dielectric Between Conductors" and "4. Optimizing Spatial Distribution of RF Radiation" remain applicable to this second aspect or embodiment of the invention having two outer conductors.

The invention claimed is:

1. A plasma chamber comprising:
    a vacuum enclosure that encloses an interior of the plasma chamber;
    a dielectric cover having a main portion extending between first and second end portions, wherein the main portion of the dielectric cover is positioned within said interior of the plasma chamber;
    an outer conductor having a main portion extending between first and second end portions, wherein the main portion of the outer conductor is positioned within the main portion of the dielectric cover;
    an inner conductor having a main portion extending between first and second end portions, wherein the main portion of the inner conductor is positioned within, and spaced away from, the main portion of the outer conductor; and first and second sealing apparatuses that respectively abut the first and second end portions of the dielectric cover such that the first and second sealing apparatuses, the dielectric cover and the vacuum enclosure in combination prevent fluid communication between the main portion of the outer conductor and the interior of the plasma chamber;

wherein the main portion of the outer conductor includes:
  (i) an inner surface facing the main portion of the inner conductor,
  (ii) an outer surface facing an inner surface of the main portion of the dielectric cover, and
  (iii) two or more apertures that extend between the inner surface of the outer conductor and the outer surface of the outer conductor.

2. The plasma chamber of claim 1, wherein:
the space between the main portion of the inner conductor and the main portion of the outer conductor is open to ambient atmosphere such that said space remains at ambient atmospheric pressure regardless of the pressure within the interior of the plasma chamber.

3. The plasma chamber of claim 1, wherein:
the space between the main portion of the inner conductor and the main portion of the outer conductor is at least partly occupied by a gas; and
the first and second sealing apparatuses provide a gas-tight seal between said space and the interior of the plasma chamber so as to enable a pressure differential between said space and the interior of the plasma chamber.

4. The plasma chamber of claim 1, wherein:
the first sealing apparatus extends between the first end portion of the dielectric cover and the vacuum enclosure.

5. The plasma chamber of claim 1, wherein:
the second sealing apparatus is positioned within the interior of the plasma chamber and does not abut the vacuum enclosure.

6. The plasma chamber of claim 1, further comprising:
an RF power source that is connected to produce an RF voltage between the inner conductor and the outer conductor.

7. The plasma chamber of claim 1, further comprising:
a first RF power source that is connected to produce a first RF voltage between the first end portion of the inner conductor and the first end portion of the outer conductor; and
a second RF power source that is connected to produce a second RF voltage between the second end portion of the inner conductor and the second end portion of the outer conductor.

8. The plasma chamber of claim 1, further comprising:
an RF power source that is connected to produce an RF voltage between the first end portion of the inner conductor and the first end portion of the outer conductor; and
a termination impedance that is connected between the second end portion of the inner conductor and the second end portion of the outer conductor.

9. The plasma chamber of claim 1, further comprising:
an RF power source having an RF power output that is connected between the inner conductor and the outer conductor;
wherein the RF power output has a wavelength that is shorter than the longest dimension of the main portion of the inner conductor and is shorter than the longest dimension of the main portion of the outer conductor.

10. The plasma chamber of claim 1, wherein said two or more apertures include:
a plurality of apertures at different longitudinal positions on the outer conductor;
wherein adjacent ones of said plurality of apertures at successive longitudinal positions on the outer conductor are offset along the circumferential dimension of the outer conductor.

11. The plasma chamber of claim 1, wherein said two or more apertures include:
a first plurality of apertures in a first sub-portion of the main portion of the outer conductor and a second plurality of apertures in a distinct second sub-portion of the main portion of the outer conductor;
wherein:
the first sub-portion extends from the first end portion of the outer conductor to the second sub-portion;
the second sub-portion extends from the first sub-portion to the center of the outer conductor; and
the fraction of the surface area of the second portion that is occupied by the second plurality of apertures is greater than the fraction of the surface area of the first portion that is occupied by the first plurality of apertures.

12. The plasma chamber of claim 1, wherein said two or more apertures include:
a first plurality of apertures in a first sub-portion of the main portion of the outer conductor and a second plurality of apertures in a distinct second sub-portion of the main portion of the outer conductor;
wherein:
the first sub-portion extends from the first end portion of the outer conductor to the second sub-portion;
the second sub-portion extends from the first sub-portion to the center of the outer conductor; and
the average area of the apertures in the second sub-portion is greater than the average area of the apertures in the first sub-portion.

13. The plasma chamber of claim 1, wherein said two or more apertures include:
a first plurality of apertures in a first sub-portion of the main portion of the outer conductor and a second plurality of apertures in a distinct second sub-portion of the main portion of the outer conductor;
wherein:
the first sub-portion extends from the first end portion of the outer conductor to the second sub-portion;
the second sub-portion extends from the first sub-portion to the center of the outer conductor; and
the average spacing between adjacent apertures in the second sub-portion is smaller than the average spacing between adjacent apertures in the first sub-portion.

14. The plasma chamber of claim 1, wherein said two or more apertures include:
a first plurality of apertures in a first sub-portion of the main portion of the outer conductor and a second plurality of apertures in a distinct second sub-portion of the main portion of the outer conductor;
wherein:
the first sub-portion extends from the first end portion of the outer conductor to the second sub-portion;
the second sub-portion extends from the first sub-portion to the center of the outer conductor;
each respective aperture is characterized by a respective angle at which its respective long axis is oriented relative to the circumferential dimension of the second conductor; and
the average of said angles of the apertures in the second sub-portion is smaller than the average of said angles of the apertures in the first sub-portion.

15. The plasma chamber of claim 1, wherein said two or more apertures include:
a plurality of apertures at successive positions progressing from a first position to a second position on the main portion of the outer conductor;
wherein:
the first position is between the second position and the first end portion of the outer conductor;
wherein the second position is between the first position and the center of the outer conductor; and
each respective aperture at said respective positions progressing from the first position to the second position has a monotonically increasing area.

16. The plasma chamber of claim 1, wherein said two or more apertures include:
a plurality of apertures at successive positions progressing from a first position to a second position on the main portion of the outer conductor;
wherein:
the first position is between the second position and the first end portion of the outer conductor;
the second position is between the first position and the center of the outer conductor; and
each respective aperture at said respective positions progressing from the first position to the second position has a monotonically decreasing spacing between adjacent apertures.

17. The plasma chamber of claim 1, wherein said two or more apertures include:
a plurality of apertures at successive positions progressing from a first position to a second position on the main portion of the outer conductor;
wherein:
the first position is between the second position and the first end portion of the outer conductor;
the second position is between the first position and the center of the outer conductor; and
each respective aperture at said respective positions progressing from the first position to the second position has a long axis at a monotonically decreasing angle relative to the circumferential dimension of the outer conductor.

18. A method of coupling electrical power to a plasma, comprising the steps of:
providing an outer conductor having a main portion extending between first and second end portions;
providing an inner conductor having a main portion extending between first and second end portions, wherein the main portion of the inner conductor is positioned within, and spaced away from, the main portion of the outer conductor;
providing a vacuum enclosure that encloses an interior of a plasma chamber;
providing a dielectric cover having a main portion extending between first and second end portions, wherein the main portion of the dielectric cover is positioned within said interior of the plasma chamber, and wherein the main portion of the outer conductor is positioned within the main portion of the dielectric cover such that the outer surface of outer conductor faces an inner surface of the main portion of the dielectric cover; and
providing first and second sealing apparatuses;
wherein the main portion of the outer conductor includes:
(i) an inner surface facing the main portion of the inner conductor,
(ii) an outer surface, and
(iii) a plurality of apertures that extend between the inner surface of the outer conductor and the outer surface of the outer conductor; and
wherein the first and second sealing apparatuses respectively abut the first and second end portions of the dielectric cover such that the first and second sealing apparatuses, the dielectric cover and the vacuum enclosure in combination prevent fluid communication between the apertures and the interior of the plasma chamber.

19. A method of coupling electrical power to a plasma, comprising the steps of:
providing a first outer conductor having a main portion extending between first and second end portions;
providing a second outer conductor having a main portion extending between first and second end portions;
providing an inner conductor having a main portion extending between first and second end portions, wherein the main portion of the inner conductor is positioned between and spaced away from the main portion of the first outer conductor and the main portion of the second outer conductor;
providing a vacuum enclosure that encloses an interior of the plasma chamber;
providing a dielectric cover having a main portion extending between first and second end portions, wherein the main portion of the dielectric cover is positioned within said interior of the plasma chamber, wherein the respective main portion of each respective outer conductor is positioned within the main portion of the dielectric cover, and wherein the respective outer surface of each respective outer conductor faces an inner surface of the main portion of the dielectric cover; and
providing first and second sealing apparatuses;
wherein the main portion of each respective outer conductor includes:
(i) an inner surface facing the main portion of the inner conductor,
(ii) an outer surface, and
(iii) a plurality of apertures that extend between the inner surface of said respective outer conductor and the outer surface of said respective outer conductor; and
wherein the first and second sealing apparatuses respectively abut the first and second end portions of the dielectric cover such that the first and second sealing apparatuses, the dielectric cover and the vacuum enclosure in combination prevent fluid communication between the interior of the plasma chamber and the apertures of the first and second outer conductors.

20. A plasma chamber comprising:
a vacuum enclosure that encloses an interior of the plasma chamber;
a dielectric cover having a main portion extending between first and second end portions, wherein the main portion of the dielectric cover is positioned within said interior of the plasma chamber;
a first outer conductor having a main portion extending between first and second end portions, wherein the main portion of the first outer conductor is positioned within the main portion of the dielectric cover;
a second outer conductor having a main portion extending between first and second end portions, wherein the main portion of the second outer conductor is positioned within the main portion of the dielectric cover;
an inner conductor having a main portion extending between first and second end portions, wherein the main portion of the inner conductor is positioned between the main portion of the first outer conductor and the main portion of the second outer conductor such that the main portion of the inner conductor is spaced away from the respective main portions of the first and second outer conductors; and first and second sealing apparatuses;

wherein the main portion of each respective outer conductor includes:
  (i) an inner surface facing the main portion of the inner conductor,
  (ii) an outer surface facing an inner surface of the main portion of the dielectric cover, and
  (iii) a plurality of apertures that extend between the inner surface of said respective outer conductor and the outer surface of said respective outer conductor; and wherein the first and second sealing apparatuses respectively abut the first and second end portions of the dielectric cover such that the first and second sealing apparatuses, the dielectric cover and the vacuum enclosure in combination prevent fluid communication between the interior of the plasma chamber and the apertures of the first and second outer conductors.

\* \* \* \* \*